(12) United States Patent
Yu et al.

(10) Patent No.: US 9,379,331 B2
(45) Date of Patent: Jun. 28, 2016

(54) SEMICONDUCTING POLYMERS

(71) Applicant: The University of Chicago, Chicago, IL (US)

(72) Inventors: Luping Yu, Chicago, IL (US); Yongye Liang, Stanfod, CA (US); Feng He, Chicago, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 14/376,354

(22) PCT Filed: Feb. 1, 2013

(86) PCT No.: PCT/US2013/024337
§ 371 (c)(1),
(2) Date: Aug. 1, 2014

(87) PCT Pub. No.: WO2013/116643
PCT Pub. Date: Aug. 8, 2013

(65) Prior Publication Data
US 2015/0041726 A1 Feb. 12, 2015

Related U.S. Application Data

(60) Provisional application No. 61/594,933, filed on Feb. 3, 2012.

(51) Int. Cl.
*C08G 75/00* (2006.01)
*H01L 51/00* (2006.01)
(Continued)

(52) U.S. Cl.
CPC .......... *H01L 51/0036* (2013.01); *C08G 61/126* (2013.01); *C08G 75/06* (2013.01); *C08K 3/04* (2013.01); *H01L 51/0043* (2013.01); *C08G 2261/124* (2013.01); *C08G 2261/146* (2013.01);
(Continued)

(58) Field of Classification Search
CPC ............ H01L 51/0036; H01L 51/0047; C08G 2261/3243
USPC ......................................... 528/377, 380, 378
See application file for complete search history.

(56) References Cited

U.S. PATENT DOCUMENTS 7,183,418 B2   2/2007   Heeney et al.
7,332,223 B2   2/2008   Sotzing et al.
(Continued)

FOREIGN PATENT DOCUMENTS

WO    WO 2008/011957 A1    1/2008
WO    WO 2010/008672 A1    1/2010
(Continued)

OTHER PUBLICATIONS

Chen, Hsiang-Yu et al., "Polymer Solar Cells with Enhanced Open-Circuit Voltage and Efficiency." Nature Photonics, vol. 3, Nov. 2009, 649-653.
(Continued)

*Primary Examiner* — Shane Fang
(74) *Attorney, Agent, or Firm* — Brinks Gilson & Lione; Ryan L. Marshall

(57) ABSTRACT

Novel semiconducting photovoltaic polymers with conjugated units that provide improved solar conversion efficiency and can be used in electro-optical and electric devices. The polymers exhibit increased solar conversion efficiency in solar devices.

18 Claims, 5 Drawing Sheets

(51) Int. Cl.
  C08G 75/06 (2006.01)
  C08K 3/04 (2006.01)
  C08G 61/12 (2006.01)
  H01L 51/42 (2006.01)

(52) U.S. Cl.
  CPC .. *C08G 2261/149* (2013.01); *C08G 2261/1412* (2013.01); *C08G 2261/1426* (2013.01); *C08G 2261/414* (2013.01); *C08G 2261/91* (2013.01); *C08G 2261/95* (2013.01); *H01L 51/0047* (2013.01); *H01L 51/4253* (2013.01)

(56) References Cited

U.S. PATENT DOCUMENTS

| | | |
|---|---|---|
| 8,436,134 B2 | 5/2013 | Yu et al. |
| 2005/0082525 A1 | 4/2005 | Heeney et al. |
| 2005/0209419 A1 | 9/2005 | Zahn et al. |
| 2008/0102559 A1 | 5/2008 | Ong et al. |
| 2008/0103286 A1 | 5/2008 | Ong et al. |
| 2009/0014693 A1 | 1/2009 | Zahn |
| 2009/0018348 A1 | 1/2009 | Zahn et al. |
| 2009/0140219 A1 | 6/2009 | Zahn |
| 2011/0124822 A1 | 5/2011 | Yu et al. |
| 2014/0005347 A1* | 1/2014 | Yu et al. ............... 528/9 |

FOREIGN PATENT DOCUMENTS

| | | | |
|---|---|---|---|
| WO | WO 2010/020329 A1 | 2/2010 | |
| WO | WO 2011/067192 A2 | 6/2011 | |
| WO | WO 2011/156478 A2 | 12/2011 | |

OTHER PUBLICATIONS

Chen, Wei et al., "Hierarchical Nanomorphologies Promote Exciton Dissociation in Polymer/Fullerene Bulk Heterojunction Solar Cells." American Chemical Society Publications, Nano Letters 2011, 11, pp. 3707-3713.

Facchetti, Antonio, "π-Conjugated Polymers for Organic Electronics and Photovoltaic Cell Applications." Chemistry of Materials, 2011, 23, 733-758.

Huo, Lijun et al., "Replacing Alkoxy Groups with Alkylthienyl Groups: A Feasible Approach to Improve the Properties of Photovoltaic Polymers." Angewandte Chemie International Edition, 2011, 50, 9697-9702.

Liang, Yongye et al., "Development of New Semiconducting Polymers for High Performance Solar Cells." J. American Chemical Society Communications: Dept. of Chemistry and the James Franck Institute, The University of Chicago, Dec. 2008, 131, 56-57.

Liang, Yongye et al., "Highly Efficient Solar Cell Polymers Developed via Fine-Tuning of Structural and Electronic Properties." J. American Chemical Society Articles: Dept. of Chemistry and the James Franck Institute, The University of Chicago, May 2009, 131, 7792-7799.

Liang, Yongye et al., "For the Bright Future—Bulk Heterojunction Polymer Solar Cells with Power Conversion Efficiency of 7.4%." Advanced Energy Materials, 2010, 22, E135-E138.

Search Report for PCT/US2013/024337, mailed Apr. 16, 2013.

Ballantyne, Amy M., et al. "Studies of Highly Regioregualr Poly(3-hexylselenophene) for Photovoltaic Applications," Advanced Materials 19:4544-4547 (2007).

First Office Action with English Translation in related Chinese Patent Application No. 200980135645.3, issued Mar. 28, 2012 (6 pages).

Heeney, Martin, et al. "Regioregular Poly(3-hexyl)selenophene: A Low Band Gap Organic Hole Transporting Polymer," The Royal Society of Chemistry Journal, pp. 5061-5063 (Oct. 1, 2007).

International Search Report for PCT/US2009/044364, dated Aug. 27, 2009, 3 pages.

International Search Report for PCT/US2012/033601, dated Sep. 6, 2012, 3 pages.

Liang, Y., et al., "Control in Energy Levels of Conjugated Polymers for Photovoltaic Application," J. Phys. Chem. C, vol. 112. pp. 7866-7871 (2008).

Notice of Preliminary Rejection in related South Korean Patent Application No. 10-2013-7030162, issued Dec. 17, 2014 (7 pages).

Patra, Asit, et al., "Poly(3,4-ethylenedioxyselenophene)," *J. Am. Chem. Soc.*, 130:6734-6736 (2008).

Patra, Asit, et al., "Tuning the Band Gap of Low-Band-Gap Polyselenophenes and Polythiophenes: The Effect of the Heteroatom," Chemistry of Materials, 23:896-906 (2011).

Saadeh, Haythem A., et al., "Polyselenopheno[3,4b]selenophene for Highly Efficient Bulk Heterojunction Solar Cells," American Chemical Society, pp. 361-365 (Feb. 9, 2012).

Salzner, U., et al., "Comparison of Geometries and Electronic Structures of Polyacetylene, Polyborole, Polycyclopentadiene, Polypyrrole, Polyfran, Polysilole, Polyphosphole, Polythiophene, Polyselenophene and Polytellurophene," *Synthetic Metals* 96:177-189 (May 22, 1998).

Second Office Action in related Chinese Patent Application No. 200980135645.3, issued Dec. 13, 2012 (3 pages).

Supplementary Search Report for EP Application No. 09798375.3, mailed Aug. 7, 2012 (5 pages).

Third Office Action in related Chinese Patent Application No. 200980135645.3, issued Jul. 3, 2013 (3 pages).

Wijsboom, Yair, et al., "Controlling Rigidity and Planarity in Conjugated Polymers: Poly(3,4-ethylenedithioselenophene)," *Angew. Chem. Int. Ed.*, 48:5443-5447 (2009).

Zade, Sanjio S., et al., "From Oligomers to Polymer: Convergence in the HOMO-LUMO Gaps of Conjugated Oligomers," *American Chemical Society* 8(23):5243-5246 (Aug. 17, 2006).

\* cited by examiner

SEMICONDUCTING POLYMERS

REFERENCE TO EARLIER FILED APPLICATION

This application is a 371 national phase of PCT/US2013/024337, filed Feb. 1, 2013, and claims the benefit under 35 U.S.C. §119(e) of U.S. Provisional Patent Application No. 61/594,933, filed Feb. 3, 2012, and titled "SEMINCONDUCTING POLYMERS," which are incorporated, in their entirety, by this reference.

TECHNICAL FIELD

This invention relates to semiconducting polymers based on semiconducting conjugated polymers. This invention also relates to their use in electro-optical and electronic devices.

BACKGROUND

Solar energy, which can be converted into electricity using photovoltaic devices, is the largest renewable energy source. Solar cells based on inorganic semiconductors can harvest solar energy efficiently but with a high cost. Polymeric solar cells (PSCs) based on the bulk heterojunction (BHJ) architecture are pursued worldwide due to their distinctive potential for fabrication on flexible substrates with large areas, light weight, and solution processability at a low cost. By blending electron-donating semiconducting polymers and electron-withdrawing fullerene derivatives together, a bi-continuous interpenetrating network with a large donor-acceptor interfacial area can endow the active layer with large photovoltaic effect. In the past decade, extensive research efforts by many groups around the world has revealed promising features of PCSs.

Notwithstanding these developments, there continues to be a need in the art for polymer solar cells that exhibit increased solar conversion efficiency.

BRIEF SUMMARY

Described herein are semiconducting photovoltaic polymers that exhibit high solar conversion efficiencies when used in electro-optical and electronic devices. There are also semiconducting polymers that are used as hole transporting material with fullerene derivatives as acceptors in electro-optical and electronic devices. The polymers are designed to achieve a low bandgap for broad absorption in the solar spectrum.

In one aspect, a polymer is disclosed having monomers of formula I:

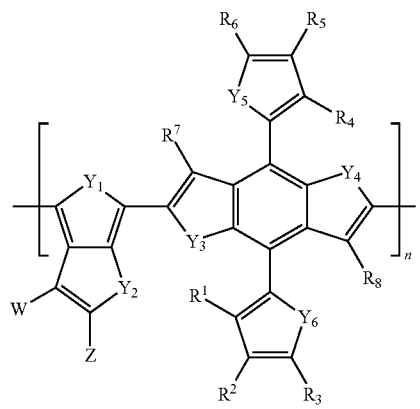

Formula I where each of $R_1$, $R_2$, $R_3$, $R_4$, $R_5$, $R_6$, $R_7$, and $R_8$ is independently H, $C_{1-30}$ alkyl, $C_{1-3}$ alkoxy, $C_{6-30}$ aryl, $C_{6-30}$ aryloxy, 5- to 30-membered heteroaryl, or 5- to 30-membered heteroaryloxy, a cross-linkable moiety or oligo (ethylene glycol); each of $Y_1$, $Y_2$, $Y_3$, $Y_4$, $Y_5$, and $Y_6$ is independently O, S, Se, or amino; Z is a $C_{1-30}$ ester, $C_{1-30}$ ketone, $C_{1-30}$ amide, cyano, $C_{1-30}$ alkyl, $C_{1-30}$ polyfluoroalkyl, $C_{1-30}$ polychloroalkyl, $C_{6-30}$ aryl, or 5- to 30-membered heteroaryl; W is H, halogen, cyano, dicyanovinyl, or tricyanovinvyl; and n is an integer.

In some embodiments, each of $Y_1$, $Y_2$, $Y_3$, $Y_4$, $Y_5$, and $Y_6$ is S. In some embodiments, Z is a $C_{1-30}$ ester. In some embodiments, Z is an ester having a branched alkyl group. In some embodiments, W is halogen. In some embodiments, W is fluoro. In some embodiments, each of $R_1$, $R_2$, $R_4$, $R_5$, $R_7$, and $R_8$ is H. In some embodiments, each of $R_3$ and $R_6$ is independently $C_{1-30}$ alkyl. In some embodiments, $R_3$ and $R_6$ are the same. In some embodiments, $R_3$ and $R_6$ are both branched alkyl. In some embodiments, $R_3$ and $R_6$ are 3,7-dimethyloctyl. In some embodiments, Z is 3,7-dimethyloctyl carbonate.

In some embodiments, the polymer includes a composition of the formula:

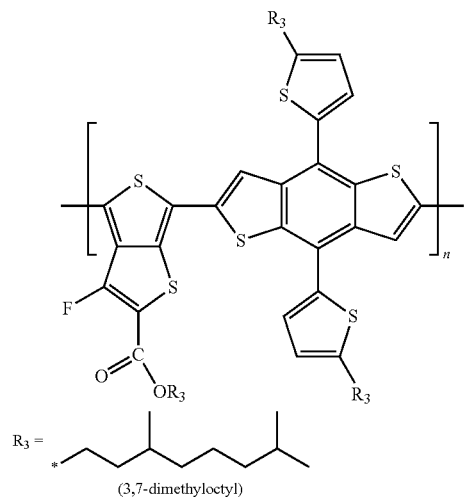

where n is an integer.

In another aspect, a polymer is disclosed having one or more compositions of formulas I-IV:

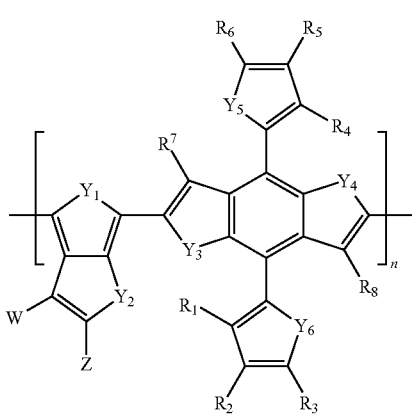

I

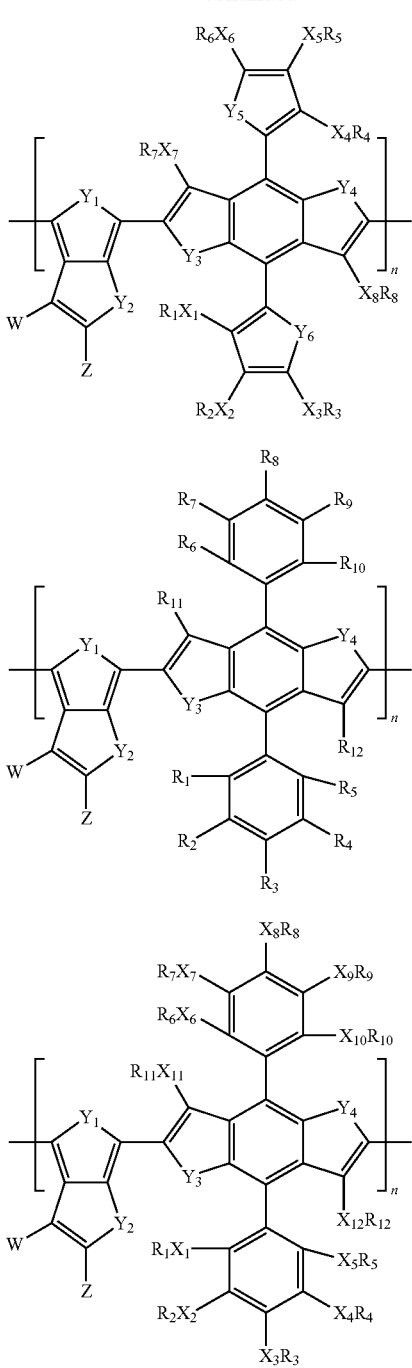

where each of $X_1, X_2, X_3, X_4, X_5, X_6, X_7, X_8, X_9, X_{10}, X_{11}$, and $X_{12}$ when present is independently O, S, NH; each of $R_1, R_2, R_3, R_4, R_5, R_6, R_7, R_8, R_9, R_{10}, R_{11}$, and $R_{12}$ is independently H, $C_{1-30}$ alkyl, $C_{1-30}$ alkoxy, $C_{6-30}$ aryl, $C_{6-30}$ aryloxy, 5- to 30-membered heteroaryl, or 5- to 30-membered heteroaryloxy, a cross-linkable moiety, or oligo (ethylene glycol); each of $Y_1, Y_2, Y_3, Y_4, Y_5$, and $Y_6$ is independently O, S, Se, or amino; Z is a $C_{1-30}$ ester, $C_{1-30}$ ketone, $C_{1-30}$ amide, cyano, $C_{1-30}$ alkyl, $C_{1-30}$ polyfluoroalkyl, $C_{1-30}$ polychloroalkyl, $C_{6-30}$ aryl, or 5- to 30-membered heteroaryl; W is H, halogen, cyano, dicyanovinyl, or tricyanovinyl; and n is an integer; provided that when any of $X_1, X_2, X_3, X_4, X_5, X_6, X_7, X_8, X_9, X_{10}, X_{11}$, and $X_{12}$ is present, then none of $R_1, R_2, R_3$, $R_4, R_5, R_6, R_7, R_8, R_9, R_{10}, R_{11}$, and $R_{12}$ is $C_{1-30}$ alkoxy, $C_{6-30}$ aryloxy, or 5- to 30-membered heteroaryloxy.

In some embodiments, the polymer is made up of a composition only of Formula I. In some embodiments, the polymer is made up of a composition only of Formula II. In some embodiments, the polymer is made up of a composition only of Formula III. In some embodiments, the polymer is made up of a composition only of Formula IV. In some embodiments, the polymer is made up of at least two of the compositions selected from Formulas I-IV.

In some embodiments, each of $Y_1, Y_2, Y_3, Y_4, Y_5$, and $Y_6$ is S. In some embodiments, $R_3$ and $R_6$ are branched $C_{1-25}$ alkyl. In some embodiments, $R_3$ and $R_6$ are 3,7-dimethyloctyl. In some embodiments, each of $R_1, R_2, R_4, R_5, R_7$, and $R_8$ is H. In some embodiments, Z is 3,7-dimethyloctyl carbonate. In some embodiments, W is halogen. In some embodiments, W is fluoro. In some embodiments, each $R_1, R_2, R_3, R_4, R_5, R_6, R_7, R_8, R_9, R_{10}, R_{11}$, and $R_{12}$, if present, is independently a $C_{1-30}$ alkyl group.

In some embodiments, the polymers identified above have a number-average molecular weight between 8 and 50 kDa. In some embodiments, the polymers identified above have polydispersity index between 1.5 and 4.

In some embodiments, the polymers described above further comprise an electron-withdrawing fullerene derivative. In some embodiments, the electron-withdrawing fullerene derivative is [6,6]-phenyl-$C_{61}$-butyric acid methyl ester. In some embodiments, the electron-withdrawing fullerene derivative is [6,6]-phenyl-$C_{71}$-butyric acid methyl ester.

In some embodiments, there is a use of the polymers described above in a solar cell, an optical device, an electroluminescent device, a photovoltaic cell, semiconducting cell, or photodiode.

DETAILED DESCRIPTION

Figure 1:
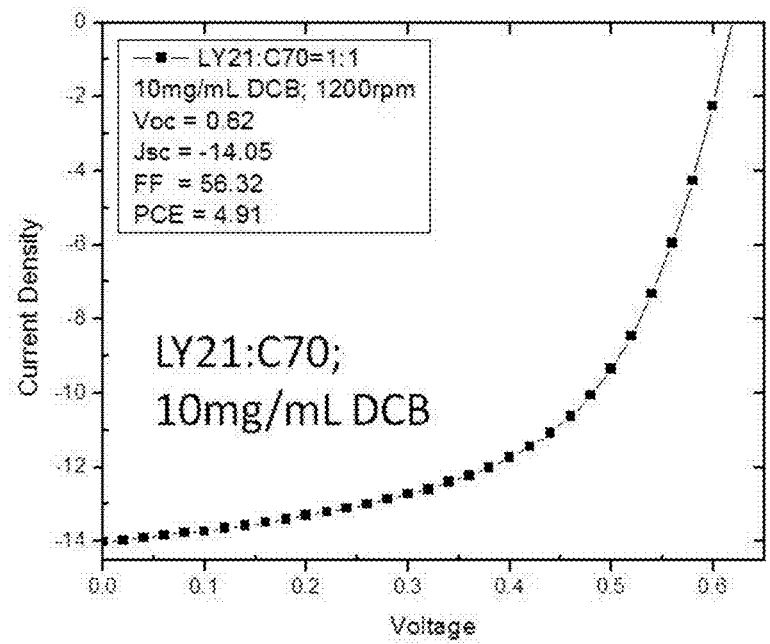
FIG. 1 shows a J-V curve of a solar cell based on LY-21.

Unless defined otherwise, all technical and scientific terms used herein have the same meaning as commonly understood to one of ordinary skill in the art to which this invention belongs. When describing the compounds, compositions, methods and processes of this invention, the following terms have the following meanings, unless otherwise indicated.

"Alkyl" by itself or as part of another substituent refers to a hydrocarbon group which may be linear, cyclic, or branched or a combination thereof having the number of carbon atoms designated (i.e., $C_{1-8}$ means one to eight carbon atoms, and $C_{1-30}$ means one to 30 carbon atoms). Examples of alkyl groups include methyl, ethyl, n-propyl, isopropyl, n-butyl, t-butyl, isobutyl, sec-butyl, cyclohexyl, cyclopentyl, (cyclohexyl)methyl, cyclopropylmethyl, bicyclo[2.2.1]heptane, bicyclo[2.2.2]octane, etc. Alkyl groups can be substituted or unsubstituted, unless otherwise indicated. Examples of substituted alkyl include haloalkyl, polyhaloalkly, such as polyfluoroalkyl and polychloroalkyl, aminoalkyl, and the like. Alkyl groups also included straight-chained and branched alkyl.

"Alkoxy" refers to the group —O-alkyl. Examples of alkoxy groups include methoxy, ethoxy, n-propoxy etc.

"Aryl" refers to a polyunsaturated, aromatic hydrocarbon group having a single ring (monocyclic) or multiple rings (bicyclic), which can be fused together or linked covalently. In some embodiments, aryl groups with 6-10 carbon atoms are disclosed, where this number of carbon atoms can be designated by $C_{6-10}$, for example. Examples of aryl groups include phenyl and naphthalene-1-yl, naphthalene-2-yl, biphenyl and the like. Aryl groups can be substituted or unsubstituted, unless otherwise indicated. "Aryloxy" refers to —O-aryl, and "heteroaryloxy" refers to the group —O-heteroaryl.

The term "amino" refers to the group —NRR', where R and R' are independently selected from hydrogen, alkyl, aryl, aralkyl and alicyclic, all except hydrogen are optionally substituted. Both R and R' can form a cyclic ring system. The ring system may be from 5-7 members and may be optionally fused with another ring group including cycloalkyl, aryl, and heteroaryl.

"Cyano" refers to the group —CN.

"Ester" refers to the group R'C(=O)O—, where R' is an alkyl group, an aryl group or an arylheterocyclic ring, as defined herein. "Arylheterocyclic ring" refers to a bi or tricyclic ring comprised of an aryl ring, as defined herein, appended via two adjacent carbon atoms of the aryl ring to a heterocyclic ring. Exemplary arylheterocyclic rings include dihydroindole, 1,2,3,4-tetrahudroquinoline, and the like.

"Ketone" refers to the group R'C(=O)—, where R' is an alkyl group, an aryl group or an arylheterocyclic ring, as defined above.

"Halo" or "halogen," by itself or as part of a substituent refers to a chlorine, bromine, iodine, or fluorine atom.

The term "heteroaryl," as used herein, refers to a mono-, bi-, or tricyclic aromatic radical or ring having from five to ten ring atoms of which at least one ring atom is selected from S, O, and N; zero, one or two ring atoms are additional heteroatoms independently selected from S, O, and N; and the remaining ring atoms are carbon, wherein any N or S contained within the ring may be optionally oxidized. Heteroaryl includes, but is not limited to, pyridinyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, benzimidazolyl, benzooxazolyl, quinoxalinyl, and the like. The heteroaromatic ring may be bonded to the chemical structure through a carbon or heteroatom.

"Heteroatom" is meant to include oxygen (O), nitrogen (N), sulfur (S) and silicon (Si).

"Haloalkyl" as a substituted alkyl group, refers to a monohaloalkyl or polyhaloakyl group, most typically substituted with from 1-3 halogen atoms. Examples include 1-chloroethyl, 3-bromopropyl, trifluoromethyl, and the like.

The photovoltaic properties of the polymers described herein were studied in polymer solar cells. Simple solar cells were used with semiconducting polymers of the formulas described herein. The power conversion efficiency (PCE) was greater than 3% and even greater than 5% in some embodiments. In some embodiments, PCE reached 5.5%.

The high conversion efficiency exhibit by the polymers described herein may be the result of an effective light harvest. The cells using the polymers absorb light in almost the entire visible spectrum. The polymer morphology also favors charge separation and charge transport. This can lead to high fill factors.

The polymers described herein are based on two main concepts: first, the donor moiety of the donor/acceptor type polymers benzo[1,2-b:4,5-b']dithiophene which contains extended π-conjugation, will enhance the π-π stacking in the polymer/PCBM blend films and facilitate the charge transport in heterojunction solar cell devices.

Second, the acceptor moiety in the polymers, thienothiophene, can support a quinoidal structure and lead to a narrow polymer bandgap, which may have an effect on harvesting solar energy. Because the thienothiophene moiety is electron-rich, an electron-withdrawing, such as an ester group, can be introduced to stabilize the resulting polymers. The semiconducting polymers described herein may be comprised of monomers represented by formulas (I) through (IV):

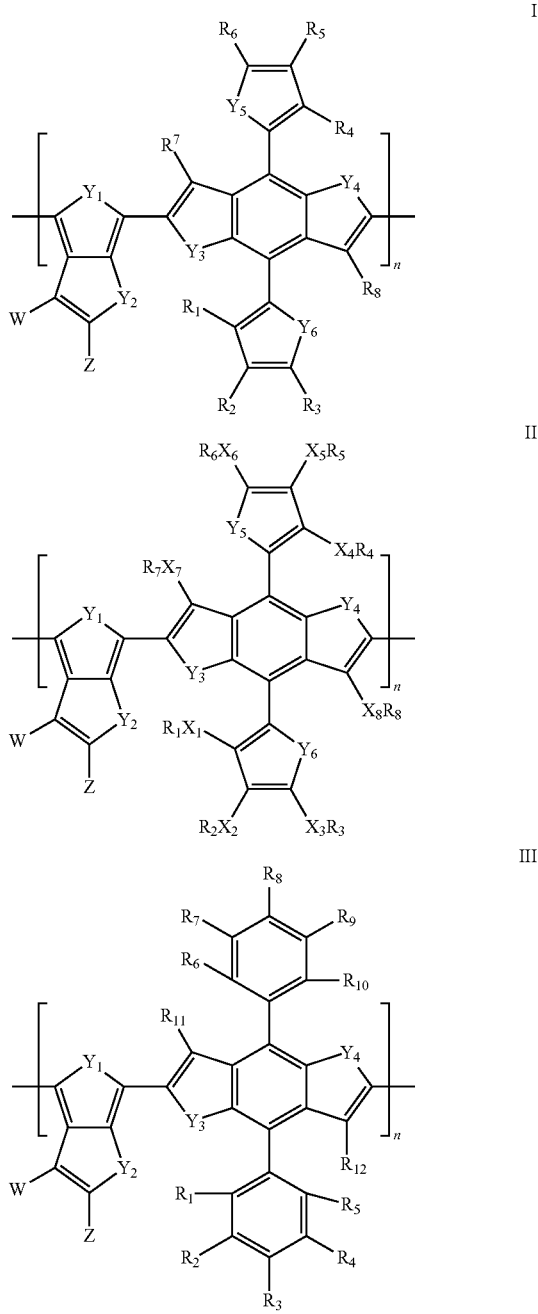

IV

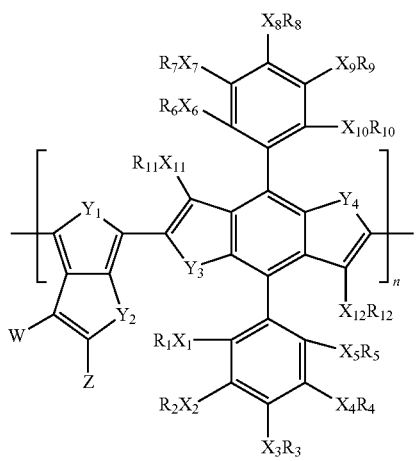

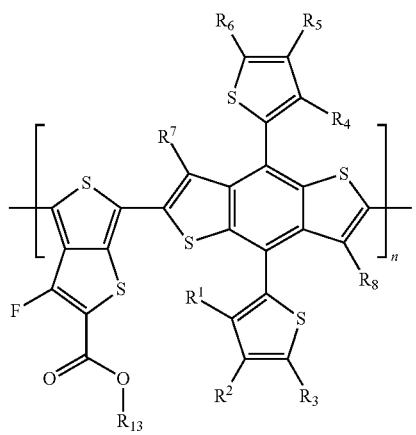
Formula Ic where each of $X_1$, $X_2$, $X_3$, $X_4$, $X_5$, $X_6$, $X_7$ and $X_8$, when present, is independently selected from O, S, N, NH, and a cross-linkable group such as an acrylate group; each of $R_1$, $R_2$, $R_3$, $R_4$, $R_5$, $R_6$, $R_7$, $R_8$, 13, $R_{10}$, $R_{11}$, and $R_{12}$, when present, is independently selected from H, $C_{1-30}$ alkyl, $C_{1-30}$ alkoxy, $C_{6-30}$ aryl, $C_{6-30}$ aryloxy, 5-30 membered heteroaryl, 5-30 membered heteroaryloxy, cross-linkable moiety, and an oligo(ethylene glycol); each of $Y_1$, $Y_2$, $Y_3$, $Y_4$, $Y_5$ and $Y_6$, when present, is independently selected from O, S, Se, and amino; Z is selected from a $C_{1-30}$ ester, $C_{1-30}$ ketone, $C_{1-30}$ amide, cyano, $C_{1-30}$ alkyl, $C_{1-30}$ polyfluoroalkyl, $C_{1-30}$ polychloroalkyl, $C_{6-30}$ aryl, and 5-30-membered heteroaryl; W is selected from H, halogen, cyano, dicyanovinyl, and a tricyanovinyl; and n is an integer.

In addition, additional embodiments of Formula (I) are shown below, including Formulas (Ia), (Ib), (Ic), and (Id):

Formula Ia

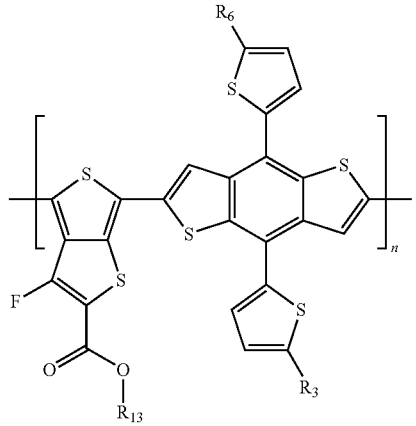
Formula Id where $R_1$, $R_2$, $R_3$, $R_4$, $R_5$, $R_6$, $R_7$, $R_8$, W, Z, have the meanings described above for Formulas (I) through (IV); and $R_{13}$ is independently selected from H, alkyl, alkoxy, aryl, aryloxy, heteroaryl, heteroaryloxy, cross-linkable moiety, and an oligo (ethylene glycol).

Some embodiments include the following:

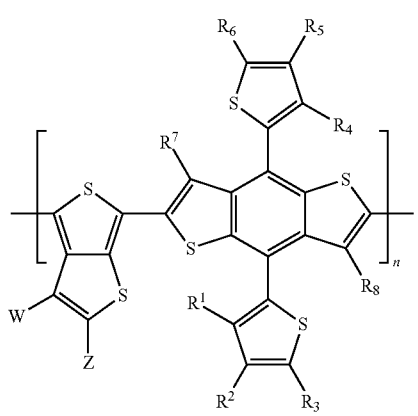

Formula Ib

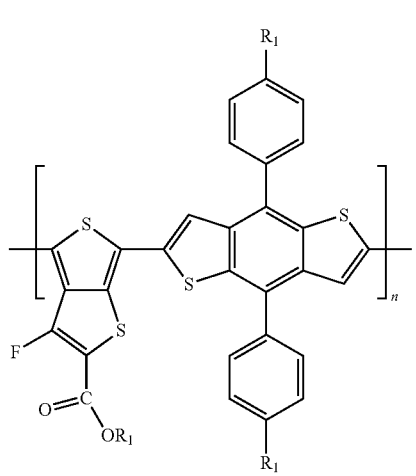
LY-AR-1

-continued

LY-AR-2

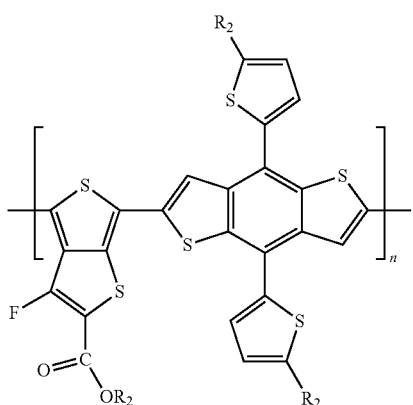

LY-AR-3

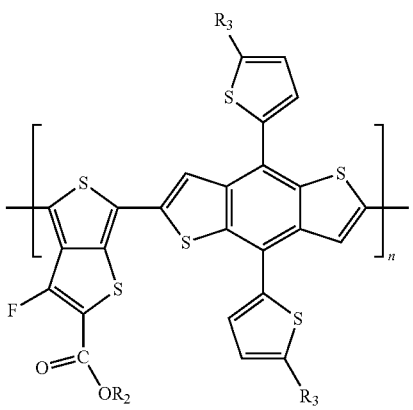

LY-21

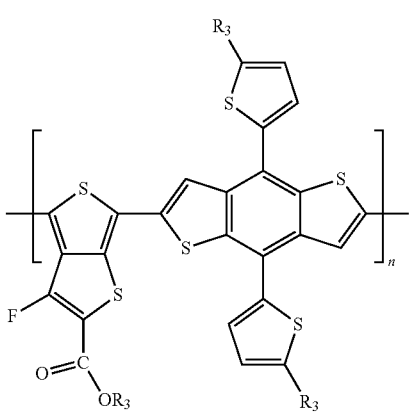

$R_1$ = n-octyl   $R_2$ = *~~~ (2-ethylhexyl)

Some embodiments include the following:

LY-22

LY-24

LY-21   $R_2$ = 
(2-ethylhexyl)

$R_3$ = *~~~~ (3,7-dimethyloctyl)

The extended, π-conjugated system in benzo[1,2-b:4,5-b'] dithiophene will enhance π-π stacking between the polymer chains.

Synthesis of the specific monomers shown above and others are described in the examples. The bis-trimethyl-stannanyl monomers were polymerized with either 2'-ethylhexyl-4,6-dibromo-thieno[3,4-b]thiophene-2-carboxylate or 2'-ethylhexyl-4,6-dibromo-3-fluorothieno[3,4-b]thiophene-2-carboxylate by the Stille polycondensation reaction to yield the designed LY and PTBT polymers.

Figure 3A:
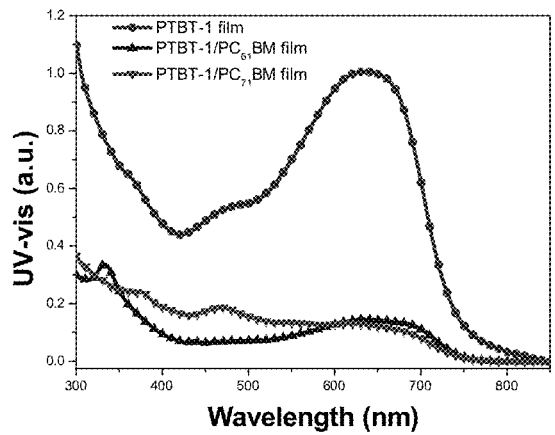
FIG. 3A shows UV/Vis absorption spectra of polymers in films and blended films with $PC_{61}BM$ and $PC_{71}BM$ for PTBT-1.
Figure 3B:
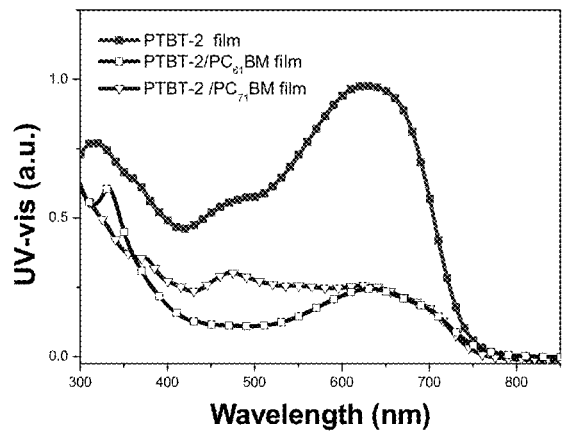
FIG. 3B shows UV/Vis absorption spectra of polymers in films and blended films with $PC_{61}BM$ and $PC_{71}BM$ for PTBT-2.
Figure 3C:
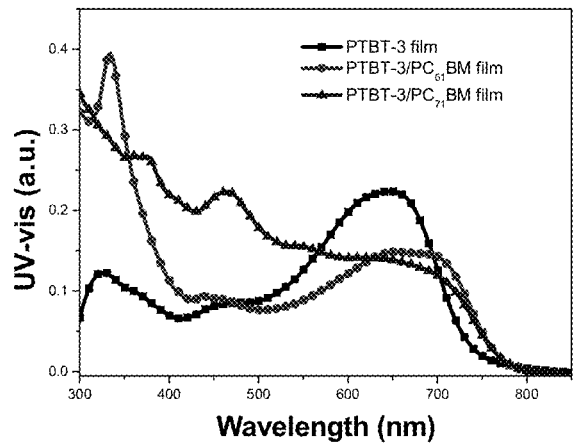
FIG. 3C shows UV/Vis absorption spectra of polymers in films and blended films with $PC_{61}BM$ and $PC_{71}BM$ for PTBT-3.

UV/vis spectra (FIG. 3a-c) of PTBT 1-3 films show absorption peaks at 640, 634, and 642 nm with the absorption onset at 746, 738, and 741 nm, which correspond to optical band gaps around 1.66, 1.68, and 1.67 eV, respectively.

In order to explore the unique features of polymers with extended π-system, devices were fabricated using LY-21, LY-24, and PTBT-1-3.

Characteristic properties of polymer LY-21 solar cells are summarized in Table 1. FIG. 1 shows a J-V curve of a solar cell based on LY-21.

TABLE 1

| 1:1 | Voc (V) | Jsc (mA/cm²) | FF (%) | PCE (%) | Best PCE (%) |
|---|---|---|---|---|---|
| 1000 rpm | 0.62 | −14.48 | 52.47 | 4.71 | 4.73 |
| 1200 rpm | 0.62 | −13.99 | 56.17 | 4.87 | 4.91 |
| 1500 rpm | 0.62 | −11.95 | 58.60 | 4.34 | 4.41 |

Figure 2:
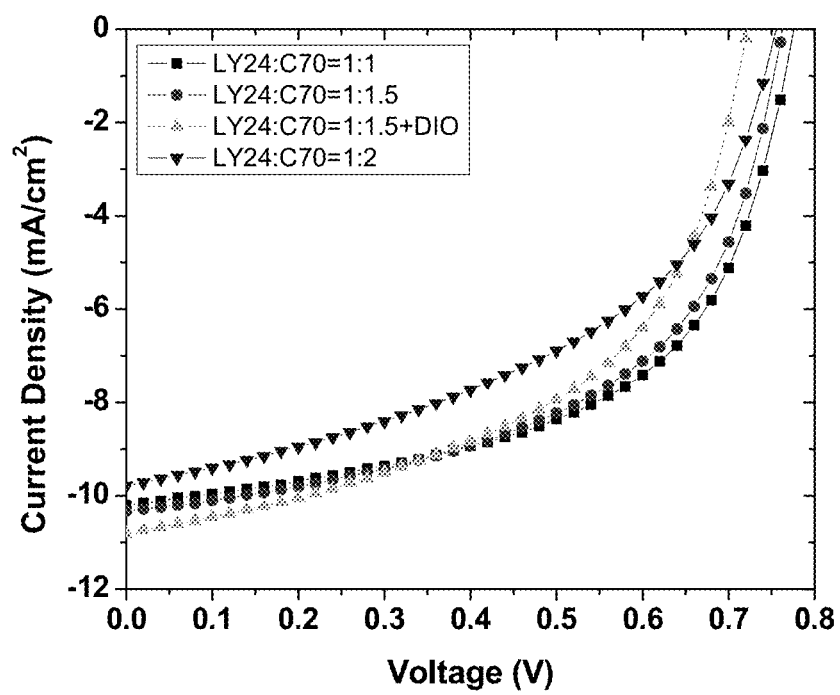
FIG. 2 shows a J-V curve of solar cell based on LY-24.

Characteristic properties of polymer LY-24 solar cells are summarized in Table 2. FIG. 2 shows J-V curves of solar cells based on LY-24.

TABLE 2

| | Voc (Voltage) | Jsc (mA/cm2) | FF (%) | PCE (%) | Max PCE (%) |
|---|---|---|---|---|---|
| LY24:C70 = 1:1 | 0.77 ± 0.01 | 10.2 ± 0.06 | 55.01 ± 0.67 | 4.32 ± 0.09 | 4.44 |
| LY24:C70 = 1:5 | 0.76 ± 0 | 10.28 ± 0.05 | 53.49 ± 0.85 | 4.18 ± 0.07 | 4.28 |
| LY24:C70 = 1:1.5 + DIO | 0.69 ± 0.01 | 11.17 ± 0.03 | 50.41 ± 2.43 | 3.90 ± 0.14 | 4.01 |
| LY24:C70 = 1:2 | 0.76 ± 0 | 9.32 ± 0.31 | 46.77 ± 0.26 | 3.31 ± 0.12 | 3.49 |

Characteristics of polymer solar cells for PTBT-1 through 3 are summarized in the Table 3.

TABLE 3

| Polymer | $V_{oc}$ (V) | $J_{sc}$ (mA/cm²) | FF (%) | PCE (%) |
|---|---|---|---|---|
| PTBT-1 | 0.90 | 7.56 | 0.50 | 3.43 |
| PTBT-2 | 0.87 | 7.92 | 0.65 | 4.48 |
| PTBT-3 | 0.80 | 9.31 | 0.74 | 5.50 |

Figure 4A:
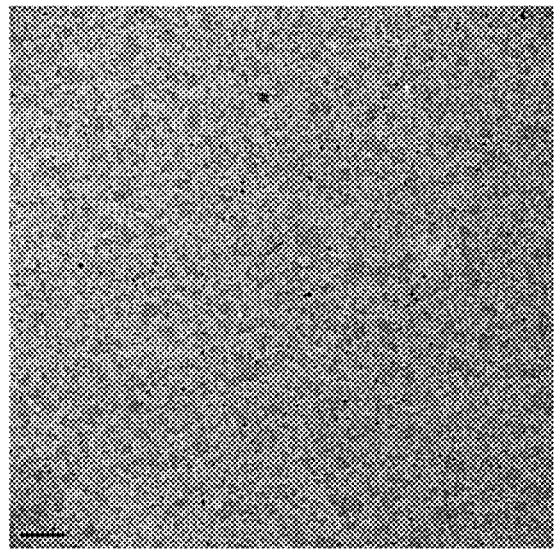
FIG. 4A shows TEM images of blended films with $PC_{71}BM$ for PTBT-1/$PC_{71}BM$ (1:1.5, w/w).
Figure 4B:
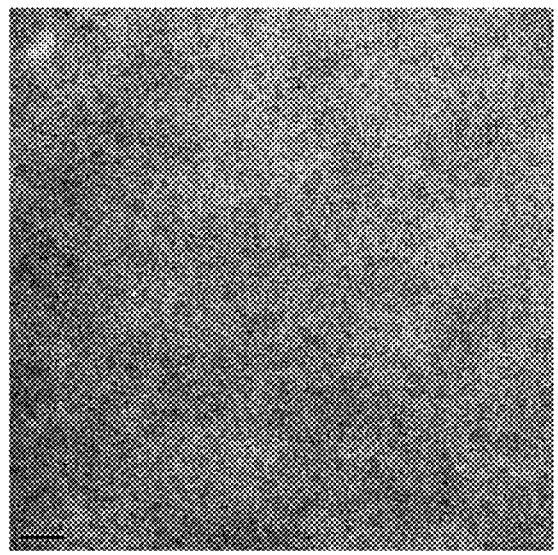
FIG. 4B shows TEM images of blended films with $PC_{71}BM$ for PTBT-2/$PC_{71}BM$ (1:1.5, w/w).
Figure 5A:
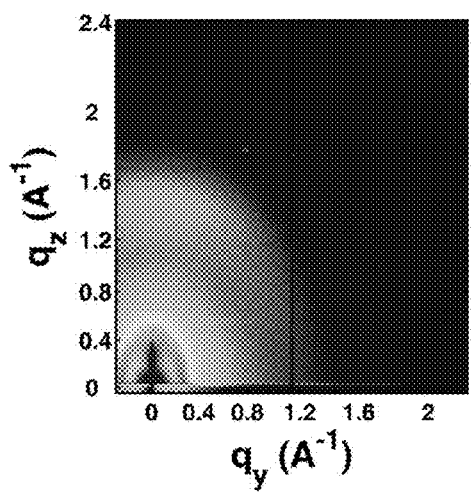
FIG. 5A shows GIWAXS of blended films with and without $PC_{71}BM$ for PTBT-1.
Figure 5B:
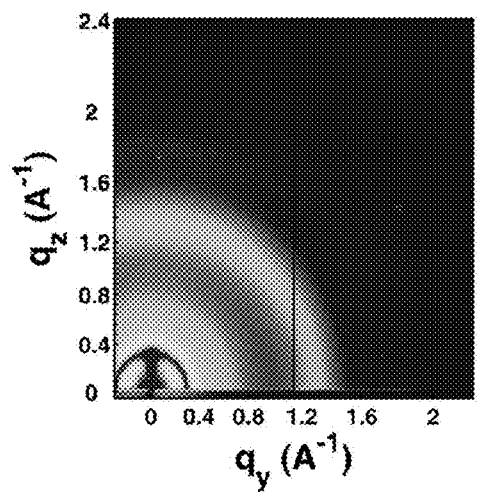
FIG. 5B shows GIWAXS of blended films with and without $PC_{71}BM$ for PTBT-1/$PC_{71}BM$.
Figure 5C:
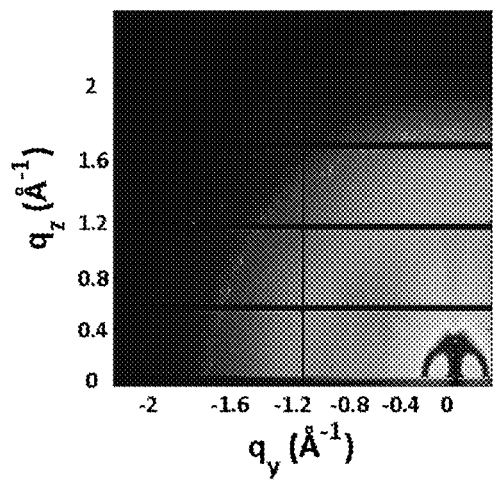
FIG. 5C shows GIWAXS of blended films with and without $PC_{71}BM$ for PTBT-2.
Figure 5D:
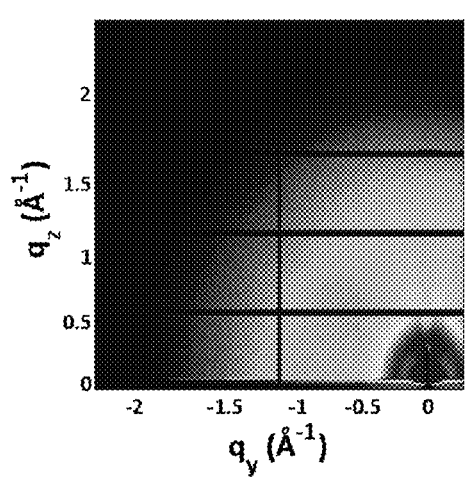
FIG. 5D shows GIWAXS of blended films with and without $PC_{71}BM$ for PTBT-2/$PC_{71}BM$.

TEM images of PTBT-1, and -2 (FIG. 4*a-b*) with different alkyl chains exhibited fine domains, and no large phases can be found.

The dimensionality of the co-monomer can also influence the molecular packing structures significantly. As shown in FIG. 5*a-d*, grazing incidence wide-angle X-ray scattering (GIWAXS) studies revealed that the π-stacking of both PTBT-1/PC$_{71}$BM and PTBT-2/PC$_{71}$BM films are parallel to the substrate surface, namely in a face-down orientation that is helpful to hole transport in the polymer films between two electrodes.

The compositions disclosed also include the semiconducting polymers and electron accepting materials including, but not limited to, Buckminsterfullerene ("fullerene") derivatives. Any electron accepting fullerene can be used with the semiconducting polymers described herein. Such fullerenes can be from $C_{60}$ to $C_{90}$. In some embodiments, the fullerene can be $C_{61}$, $C_{71}$, $C_{81}$, or $C_{91}$. The fullerene can be [6,6]-phenyl-C61-butyric acid methyl ester (PC61BM), having the following formula:

The polymer and fullerene can blend as a mixture. In another aspect, the conjugates can be joined with the fullerenes as shown below:

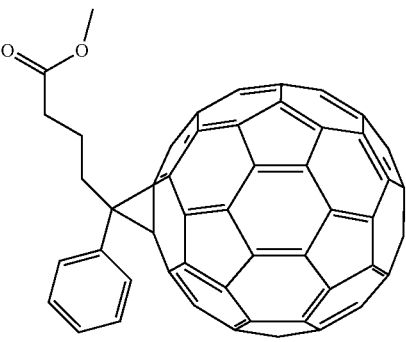

-continued

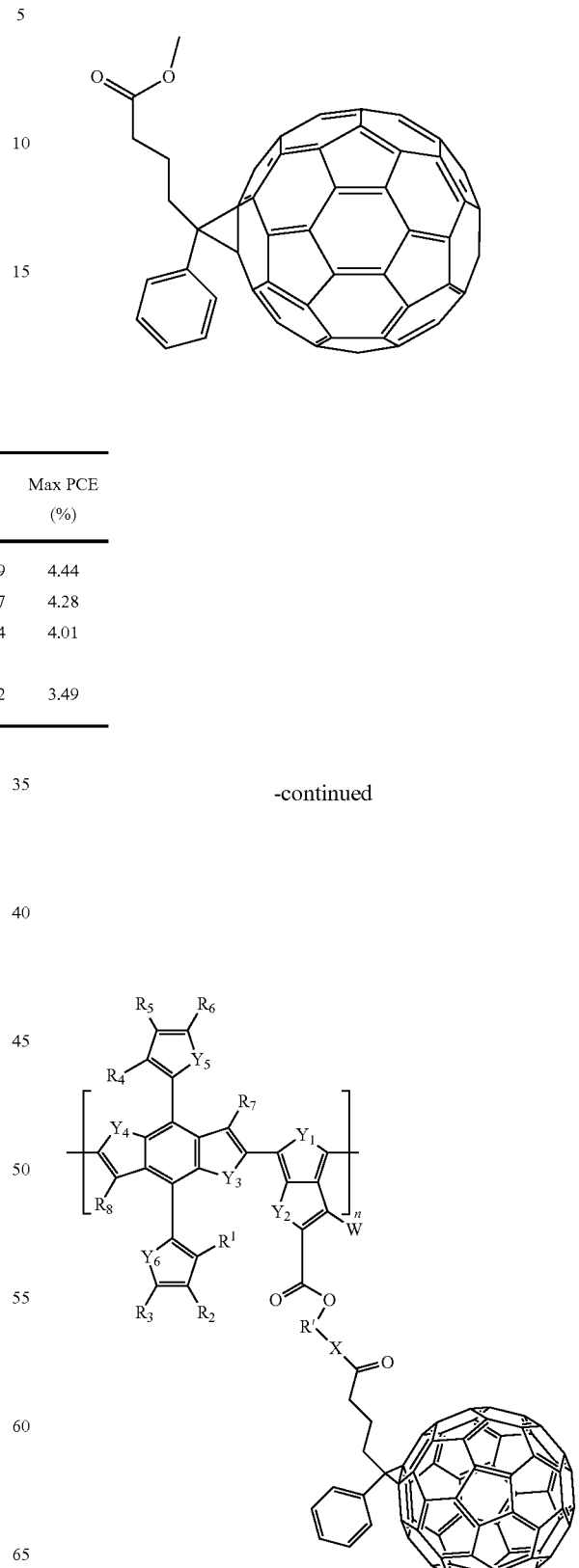

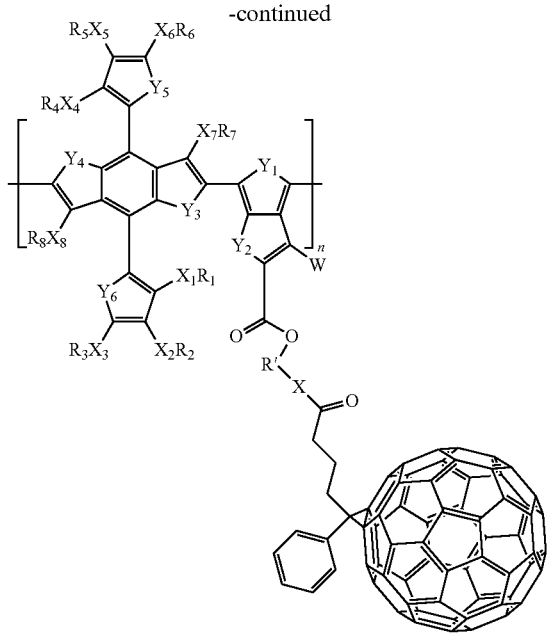

where R' is —(CH2)m; m is an integer from 2 to 16; X is selected from O, S, NH, —O—NH—; each $X_1$, $X_2$, $X_3$, $X_4$, $X_5$, $X_6$, $X_7$ and $X_8$, when present, is independently O, S, N, NH, or a cross-linkable group such as an acrylate group; each R1, R2, R3, R4, R5, R6, R7 and R8 is independently a H, C1-30 alkyl, C1-30 alkoxy, C6-30 aryl, C6-30 aryloxy, 5- to 30-membered heteroaryl, 5- to 30-membered heteroaryloxy, cross-linkable moiety, or an oligo (ethylene glycol); each Y1, Y2, Y3, Y4, Y5 and Y6 are independently O, S, Se, or an amino; Z is a C1-30 ester, C1-30 ketone, C1-30 amide, cyano, C1-30 alkyl, C1-30 polyfluoroalkyl, C1-30 polychloroalkyl, C6-30 aryl, or 5- to 30-membered heteroaryl; W is H, halogen, cyano, dicyanovinyl, or a tricyanovinyl; and n is an integer.

In one aspect, the semiconducting polymers and the conjugates described herein may be used in devices such as a solar cell, an optical device, an electroluminescent device, a photovoltaic cell, semiconducting cell, or photodiode. The conjugates of the semiconducting polymers described herein may be used in a solar cell, an optical device, an electroluminescent device, a photovoltaic cell, semiconducting cell, photodiode or polymeric field effect transistors.

The semiconducting polymers described herein may be incorporated onto a substrate by dissolving one or more of the polymers described herein with a fullerene derivative in a solvent and applying the resulting composite onto a substrate.

The one or more of the polymers can be co-dissolved with a fullerene derivative in 1,2-dichlorobenzene, chlorobenzene, chloroform, or toluene. Polymers can be in concentrations in a range of about 5 to about 20 mg/ml or any combination or subcombination therein.

The polymer/fullerene composite can then be applied onto a substrate. Suitable substrates such as Indium Tin Oxide (ITO)-coated glass that are known in the art can be used. The composite can be applied onto the substrate using any variety of processes suitable for layer application or casting. Spin casting can be used to apply a thin layer or film of the composite blend onto a substrate. The layer of composite blend can be from about 80 nm to about 150 nm thick. Layer thickness will vary depending on the application of the composite blend and the substrate. Therefore, provided herein is a photovoltaic film comprising a semiconducting polymer as described herein with a fullerene derivative.

Semiconducting polymers described herein can have alternating benzo[1,2-b:4,5-b']dithiophene and thieno[3,4-b]thiopheneunits. The physical properties of these polymers can be finely tuned for photovoltaic application. The HOMO energy levels of the polymer can be lowered by substituting alkoxy side chains to the less electron donating alkyl chains or introducing electron withdrawing fluorine into the polymer backbone, leading to an increase in $V_{OC}$ for polymer solar cells. The side chains and substitute groups also affect a polymer's absorption and hole mobility, as well as the miscibility with fullerene, all influencing polymer solar cell performances. Films prepared from mixed solvent exhibit finely distributed polymer/fullerene interpenetrating network and significantly enhanced solar cell conversion efficiency. A power conversion efficiency over 5.6% can be achieved in solar cells based on fluorinated PTAT-3/PC61BM composite films prepared from mixed solvents.

Throughout this specification, various indications have been given as to preferred and alternative embodiments of the invention. However, it should be understood that the invention is not limited to any one of these. It is, therefore, intended that the foregoing detailed description be regarded as illustrative rather than limiting, and that it be understood that it is the appended claims, including all equivalents, that are intended to define the spirit and scope of this invention.

EXAMPLES

Methods and Materials: Otherwise stated, all of the chemicals are used as received from Aldrich. THF and toluene were distilled under nitrogen protection from Na/benzophenone before reaction. $^1$H NMR spectra were recorded on Bruker DRX-400 or DRX-500 spectrometers with deuterated chloroform, dichloromethane and 1,1,2,2-tetrachloroethane, respectively. Molecular weights and distributions of polymers were determined by using a Waters GPC liquid chromatograph equipped with a Waters 515 HPLC pump, a Waters 2414 refractive index detector, and a Waters 2489 UV/Visible detector. Polystyrene standards (Aldrich) were used for calibration, and THF was used as the eluent.

Synthesis Procedures.

Scheme 1. Synthesis of monomers and LY-21 & LY-AR-3.

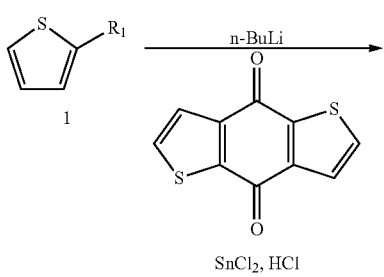

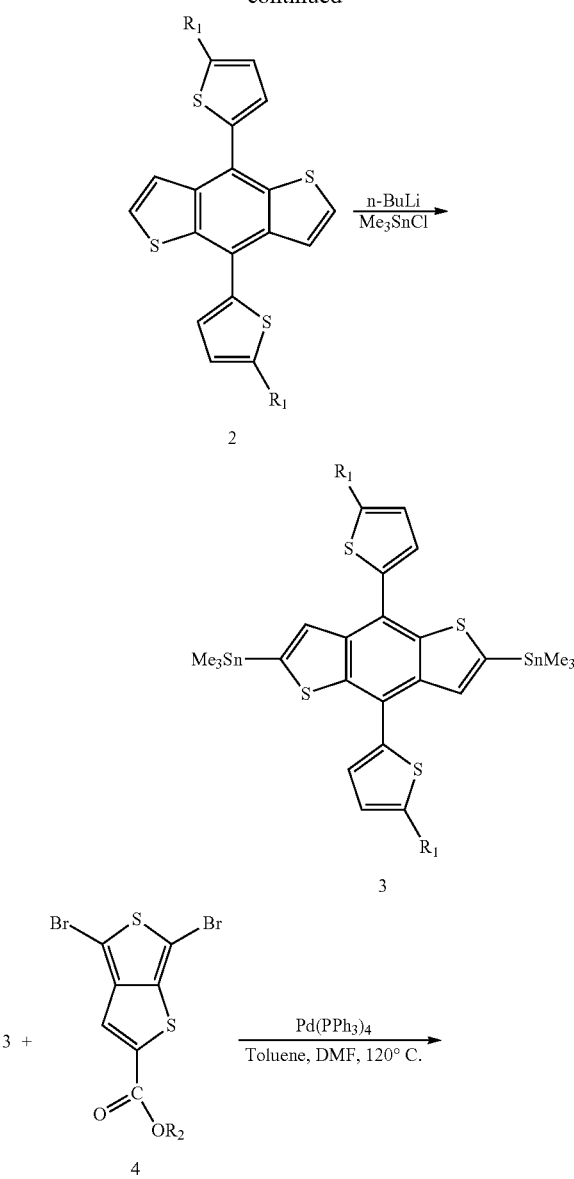

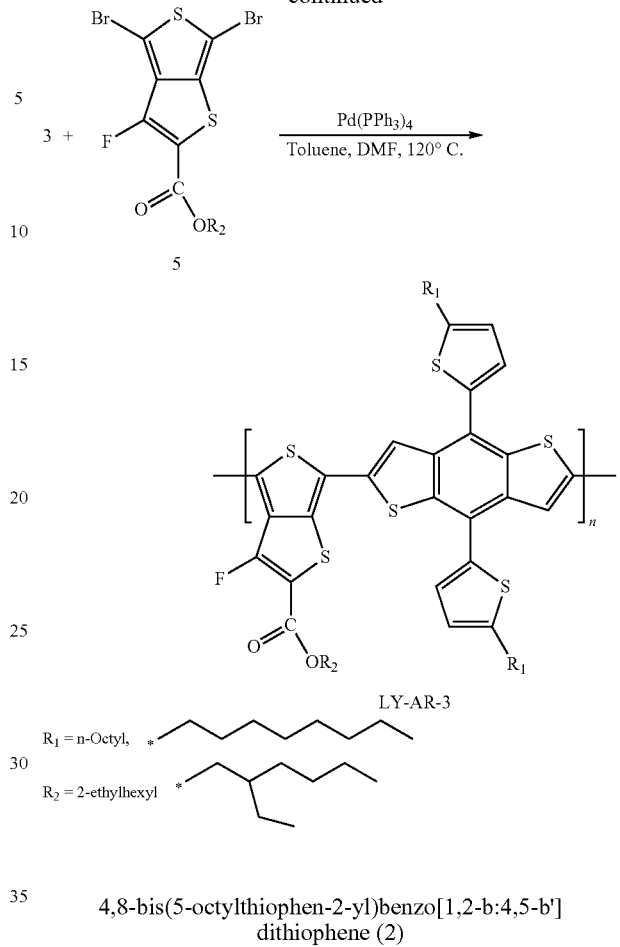

4,8-bis(5-octylthiophen-2-yl)benzo[1,2-b:4,5-b']dithiophene (2)

To a solution of 1 (4.41 g, 22.5 mmol) in 25 mL THF, n-butyllithium (23.6 mmol, 9.45 mL) was added dropwise at −78° C., then the mixture was slowly warmed up to room temperature and stirred for 2 h. 4,8-dehydrobenzo[1,2-b:4,5-b']dithiophene-4,8-dione (1.65 g, 7.5 mmol) was then added to the solution and the mixture was stirred for overnight at room temperature. $SnCl_2$ (8.54 g, 45 mmol) in 10% HCl (24 mL) was added, and the mixture was stirred for an additional 1 h and poured into ice water. The mixture was extracted by ether three times, and the combined organic solution was dried over anhydrous $Na_2SO_4$ and concentrated. Further purification was carried out by column chromatography using hexanes as eluent to obtain pure 2 as a solid (2.17 g, yield 50%). $^1$H NMR (500 MHz, $CDCl_3$) δ: 7.64 (d, 2H), 7.45 (d, 2H), 7.29 (d, 2H), 6.91 (s, 2H), 2.93 (t, 4H, J=7.5), 1.80 (m, 4H), 1.26-1.46 (m, 20H), 0.87-0.91 (m, 6H).

2,9-bis(trimethyltin)-4,8-bis(5-octylthiophen-2-yl)benzo[1,2-b:4,5-b']dithiophene (3)

2 (1.85 g, 3.2 mmol) was dissolved in 30 mL anhydrous THF and cooled to −78° C. under $N_2$ protection. n-Butyllithium (2.95 mL, 7.4 mmol) was added dropwise. The mixture was kept at −78° C. for 1 h and then slowly heated up to room temperature for another 2 hour. Then the mixture was cooled to −78° C. again, and 9.25 mL (9.25 mmol) of trimethyltin chloride solution (1 M in hexane) was added by syringe and slowly heated up to room temperature to keep stirring for another 12 h. After that, the reaction was quenched with 50 mL of water and extracted with ether. The organic extraction was dried with anhydrous $Na_2SO_4$ and evaporated to remove the solvent. Recrystallization of the residue from isopropanol yields the titled compound as a light yellow solid (2.32 g, 80%). $^1$H NMR (500 MHz, CDCl$_3$) δ: 7.68 (d, 2H), 7.31 (d, 2H), 6.92 (s, 2H), 2.85 (t, 4H, J=7.5), 1.80 (m, 4H), 1.35-1.30 (m, 20H), 0.87-0.91 (m, 6H), 0.39 (s, 18H).

LY-21:

Thieno[3,4-b]thiophene monomer 4 (227.1 mg, 0.5 mmol), compound 3 (452.3 mg, 0.5 mmol) and Pd(PPh$_3$)$_4$ (24.5 mg) were weighted into a 25 mL one-neck round-bottom flask. The flask was subjected to three successive cycles of vacuum followed by refilling with argon. Then anhydrous DMF (2 mL) and anhydrous toluene (8 mL) were added via a syringe. The polymerization was carried out at 120° C. for 1 day under N$_2$ protection. The raw product was precipitated into methanol and collected by filtration. The precipitate was dissolved in chloroform and filtered through Celite. After precipitated from methanol again, the collected polymer was washed with methanol (8 h), hexanes (12 h) and acetone (5 h) in a Soxhlet apparatus. Finally the polymer was extracted with chloroform. The polymer solution was condensed and precipitated in methanol. The precipitate was collected and dried by vacuum overnight to yield LY-21 (350 mg, 80%).

LY-AR-3:

Thieno[3,4-b]thiophene monomer 5 (236.1 mg, 0.5 mmol), compound 3 (452.3 mg, 0.5 mmol) and Pd(PPh$_3$)$_4$ (24.5 mg) were weighted into a 25 mL one-neck round-bottom flask. The flask was subjected to three successive cycles of vacuum followed by refilling with argon. Then anhydrous DMF (2 mL) and anhydrous toluene (8 mL) were added via a syringe. The polymerization was carried out at 120° C. for 1 day under N$_2$ protection. The raw product was precipitated into methanol and collected by filtration. The precipitate was dissolved in chloroform and filtered through Celite. After precipitated from methanol again, the collected polymer was washed with methanol (8 h), hexanes (12 h) and acetone (5 h) in a Soxhlet apparatus. Finally the polymer was extracted with chloroform. The polymer solution was condensed and precipitated in methanol. The precipitate was collected and dried by vacuum overnight to yield LY-21 (37 mg, 85%).

Scheme 2. Synthesis of monomers and LY-24.

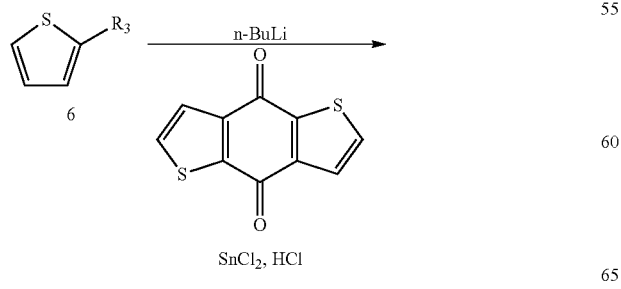

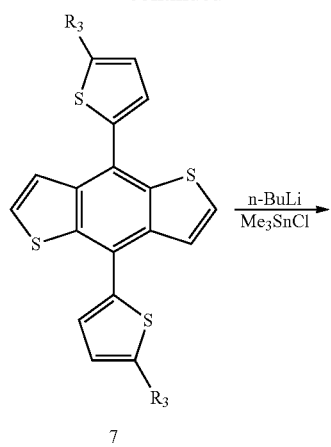

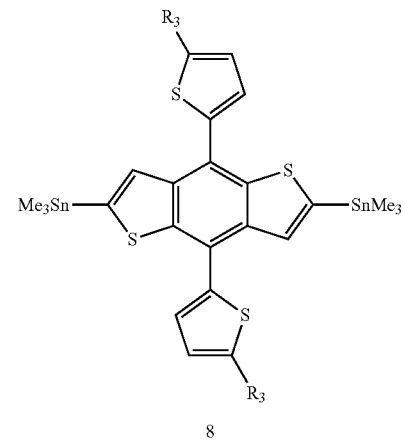

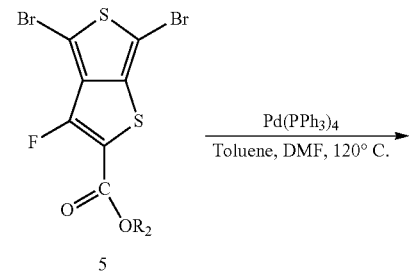

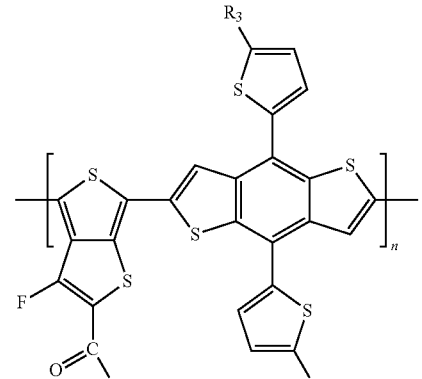

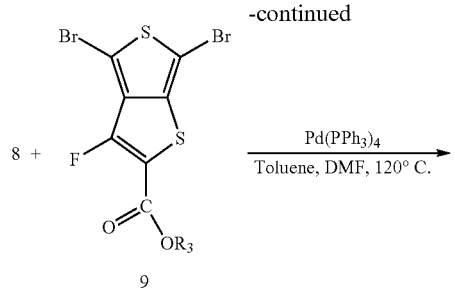

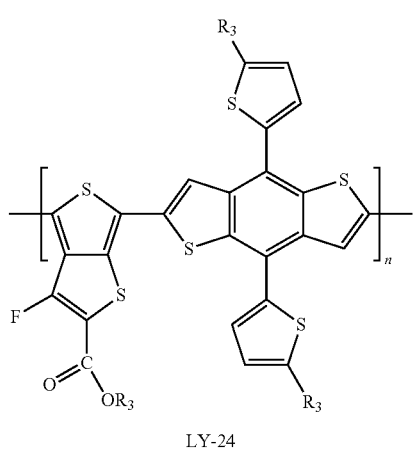

LY-24

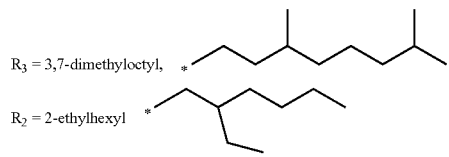

4,8-bis(5-(3,7-dimethyloctyl)-2-yl)benzo[1,2-b:4,5-b']dithiophene (7)

To a solution of 6 (5.04 g, 22.5 mmol) in 25 mL THF, n-butyllithium (23.6 mmol, 9.45 mL) was added dropwise at −78° C., then the mixture was slowly warmed up to room temperature and stirred for 2 h. 4,8-dehydrobenzo[1,2-b:4,5-b']dithiophene-4,8-dione (1.65 g, 7.5 mmol) was then added to the solution and the mixture was stirred for overnight at room temperature. SnCl$_2$ (8.54 g, 45 mmol) in 10% HCl (24 mL) was added, and the mixture was stirred for an additional 1 h and poured into ice water. The mixture was extracted by ether three times, and the combined organic solution was dried over anhydrous Na$_2$SO$_4$ and concentrated. Further purification was carried out by column chromatography using hexanes as eluent to obtain pure compound 7 as a solid (1.90 g, yield 40%). $^1$H NMR (500 MHz, CDCl$_3$) δ: 7.65 (d, 2H), 7.45 (d, 2H), 7.29 (d, 2H), 6.92 (t, 2H), 2.97 (m, 4H), 1.63 (m, 2H), 1.20-1.57 (m, 18H), 0.89-0.98 (m, 18H).

2,9-bis(trimethyltin)-4,8-bis(5-(3,7-dimethyloctyl)-thiophen-2-yl)benzo[1,2-b:4,5-b']dithiophene (8)

7 (2.03 g, 3.2 mmol) was dissolved in 30 mL anhydrous THF and cooled to −78° C. under N$_2$ protection. n-Butyl-lithium (2.95 mL, 7.4 mmol) was added dropwise. The mixture was kept at −78° C. for 1 h and then slowly heated up to room temperature for another 2 hour. Then the mixture was cooled to −78° C. again, and 9.25 mL (9.25 mmol) of trimethyltin chloride solution (1 M in hexane) was added by syringe and slowly heated up to room temperature to keep stirring for another 12 h. After that, the reaction was quenched with 50 mL of water and extracted with ether. The organic extraction was dried with anhydrous Na$_2$SO$_4$ and evaporated to remove the solvent. Recrystallization of the residue from isopropanol yields the titled compound as a light yellow solid (2.46 g, 80%). $^1$H NMR (500 MHz, CDCl$_3$) δ: 7.65 (s, 2H), 7.31 (d, 2H), 6.93 (s, 2H), 2.98 (m, 4H), 1.84 (m, 2H), 1.15-1.61 (m, 18H), 0.98 (d, 6H), 0.89 (d, 12H), 0.39 (s, 18H).

LY-22:

Thieno[3,4-b]thiophene monomer 5 (227.1 mg, 0.5 mmol), compound 8 (480.3 mg, 0.5 mmol) and Pd(PPh$_3$)$_4$ (24.5 mg) were weighted into a 25 mL one-neck round-bottom flask. The flask was subjected to three successive cycles of vacuum followed by refilling with argon. Then anhydrous DMF (2 mL) and anhydrous toluene (8 mL) were added via a syringe. The polymerization was carried out at 120° C. for 1 day under N$_2$ protection. The raw product was precipitated into methanol and collected by filtration. The precipitate was dissolved in chloroform and filtered through Celite. After precipitated from methanol again, the collected polymer was washed with methanol (8 h), hexanes (12 h) and acetone (5 h) in a Soxhlet apparatus. Finally the polymer was extracted with chloroform. The polymer solution was condensed and precipitated in methanol. The precipitate was collected and dried by vacuum overnight to yield LY-22 (400 mg, 85%).

LY-24:

Thieno[3,4-b]thiophene monomer 9 (250.1 mg, 0.5 mmol), compound 8 (480.3 mg, 0.5 mmol) and Pd(PPh$_3$)$_4$ (24.5 mg) were weighted into a 25 mL one-neck round-bottom flask. The flask was subjected to three successive cycles of vacuum followed by refilling with argon. Then anhydrous DMF (2 mL) and anhydrous toluene (8 mL) were added via a syringe. The polymerization was carried out at 120° C. for 1 day under N$_2$ protection. The raw product was precipitated into methanol and collected by filtration. The precipitate was dissolved in chloroform and filtered through Celite. After precipitated from methanol again, the collected polymer was washed with methanol (8 h), hexanes (12 h) and acetone (5 h) in a Soxhlet apparatus. Finally the polymer was extracted with chloroform. The polymer solution was condensed and precipitated in methanol. The precipitate was collected and dried by vacuum overnight to yield LY-24 (399 mg, 82%).

Scheme 3. Synthesis of Polymer LY-23, LY-25 & LY-26.

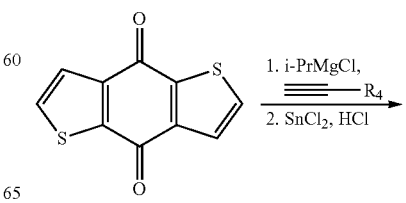

-continued
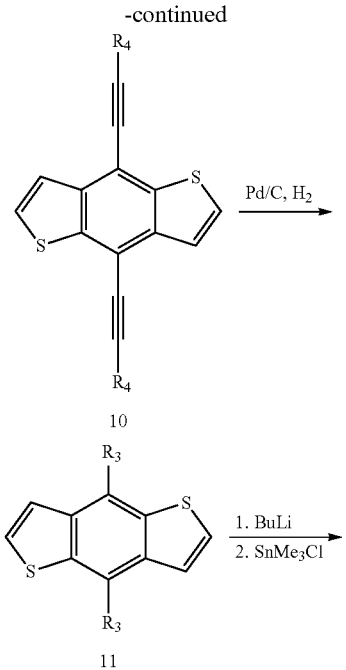
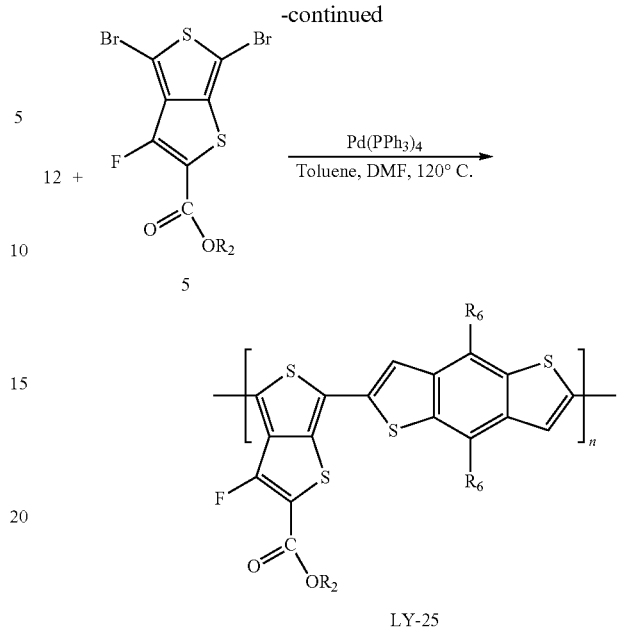
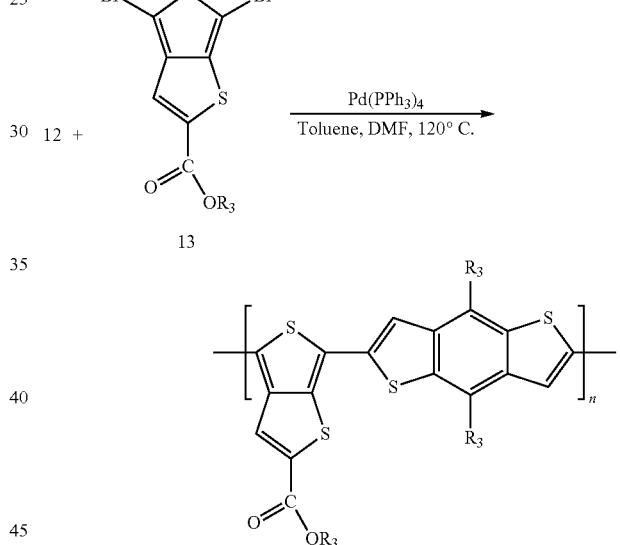
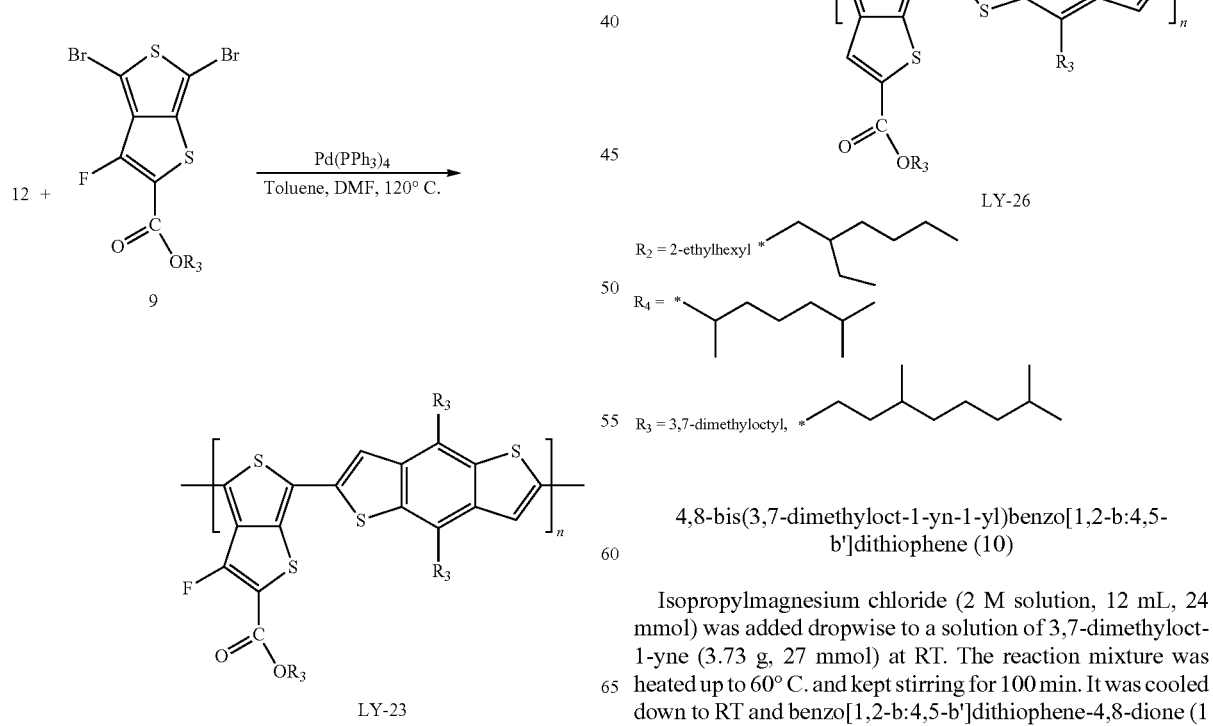
4,8-bis(3,7-dimethyloct-1-yn-1-yl)benzo[1,2-b:4,5-b']dithiophene (10)
Isopropylmagnesium chloride (2 M solution, 12 mL, 24 mmol) was added dropwise to a solution of 3,7-dimethyloct-1-yne (3.73 g, 27 mmol) at RT. The reaction mixture was heated up to 60° C. and kept stirring for 100 min. It was cooled down to RT and benzo[1,2-b:4,5-b']dithiophene-4,8-dione (1 g, 4.53 mmol) was added. The reaction mixture was hated up to 60° C., and kept for 60 min. It was then cooled to RT and 7 g SnCl$_2$ in HCl solution (16 mL 10%) was added dropwise to the reaction mixture. The reaction mixture was heated at 65° C. for 60 min, then cooled down to room temperature and poured into 100 mL water. It was extracted with 50 mL hexanes twice. The organic phase was combined and dried with anhydrous Na$_2$SO$_4$ and the organic solvent was removed by vacuum evaporation. The residue was purified by column chromatography on silica with hexanes/dichloromethane (3/1, volume ratio), yielding compound 10 (1.88 g, 90%).

4,8-bis(3,7-dimethyloctyl)benzo[1,2-b:4,5-b'] dithiophene (11)

To the solution of compound 2 (1.88 g, 4.07 mmol) in 75 mL THF was added Pd/C (0.45 g, 10%), and reaction mixture was kept in a hydrogen atmosphere for 18 h at RT. The mixture was filtered with Celite and solvent was removed by vacuum evaporation. The residue was purified by column chromatography on silica with hexane as the eluent, yielding compound 11 (1.08 g, 56%) as white solid.

2,6-Bistrimethyltin-4,8-bis(3,7-dimethyloctyl)benzo [1,2-b:4,5-b']dithiophene (12)

Compound 11 (1.08 g, 2.3 mmol) was dissolved in 20 mL anhydrous THF and cooled in acetone/dry ice bath under nitrogen protection. Butyllithium solution (2.3 mL, 5.7 mmol) was added dropwise with stirring. The mixture was kept in dry ice bath for 30 mins and then RT for 30 mins. The mixture was cooled into the dry ice bath and 6.5 mL (6.5 mmol) trimethyltin chloride solution (1M in hexane) was added and kept stirring at RT for overnight. The mixture was quenched with 50 mL water and extracted with hexanes. The organic extraction was dried with anhydrous sodium sulfate and evaporated in vacuo. Recrystallization of the residue from isopropanol yields the titled compound (1.61 g, 88%).

LY-23:

Thieno[3,4-b]thiophene monomer 9 (250.1 mg, 0.5 mmol), compound 12 (398.2 mg, 0.5 mmol) and Pd(PPh$_3$)$_4$ (24.5 mg) were weighted into a 25 mL one-neck round-bottom flask. The flask was subjected to three successive cycles of vacuum followed by refilling with argon. Then anhydrous DMF (2 mL) and anhydrous toluene (8 mL) were added via a syringe. The polymerization was carried out at 120° C. for 1 day under N$_2$ protection. The raw product was precipitated into methanol and collected by filtration. The precipitate was dissolved in chloroform and filtered through Celite. After precipitated from methanol again, the collected polymer was washed with methanol (8 h), hexanes (12 h) and acetone (5 h) in a Soxhlet apparatus. Finally the polymer was extracted with chloroform. The polymer solution was condensed and precipitated in methanol. The precipitate was collected and dried by vacuum overnight to yield LY-23 (323 mg, 80%).

LY-25 and LY-26 were prepared by polymerization of monomer 5, monomer 13 with compound 12 respectively with yield at around 80%.

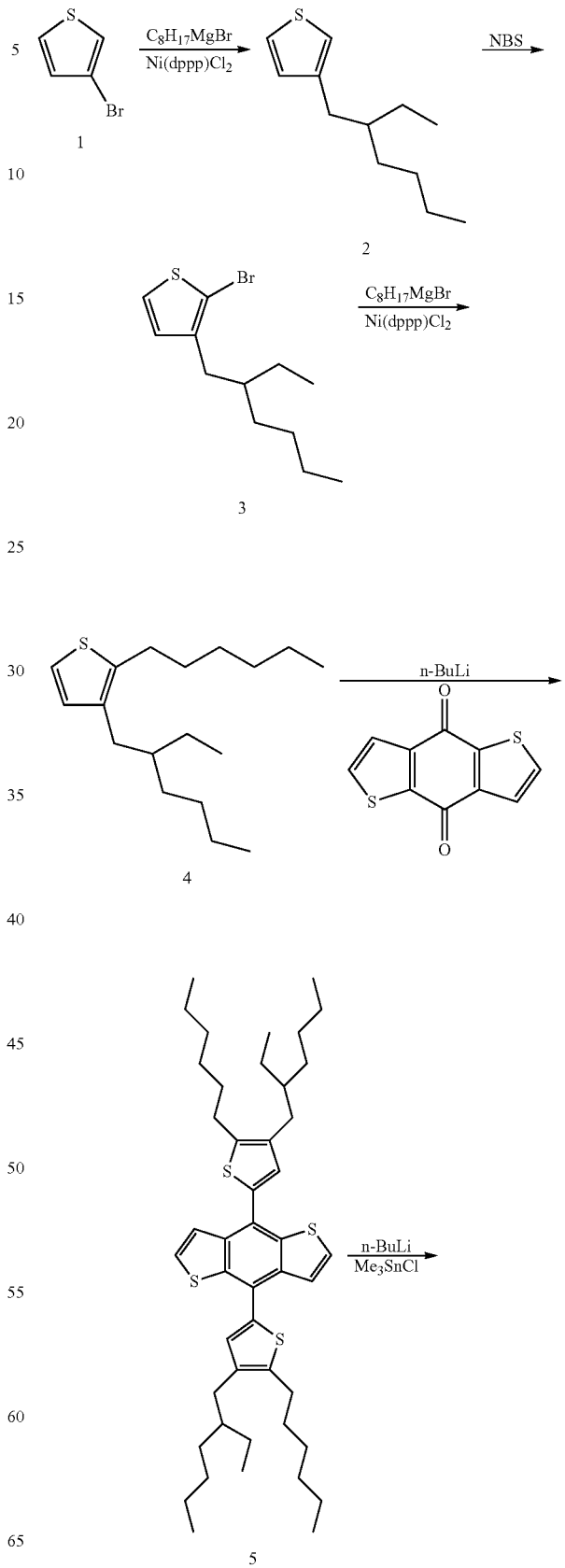

Scheme 4. The synthetic route for monomers and polymers PTBT-X

-continued

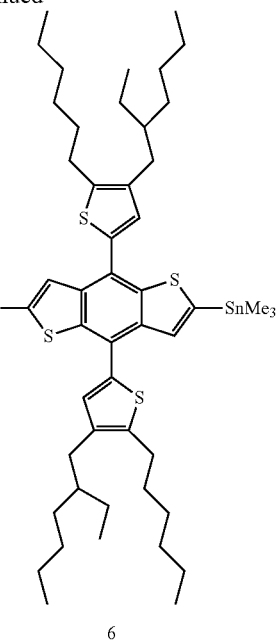

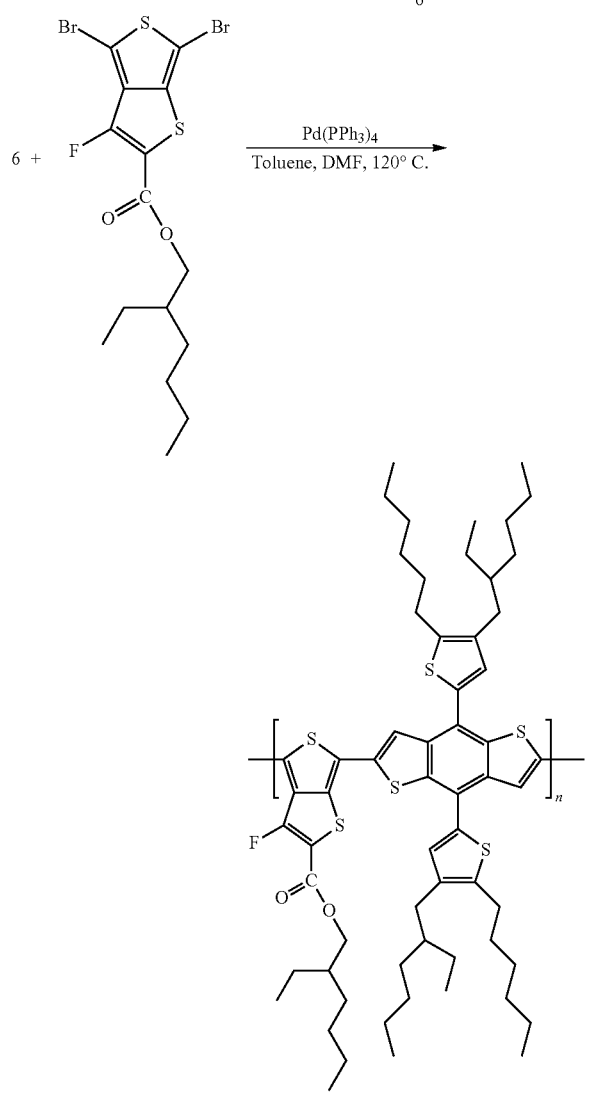

3-(2'-ethyl-1'-hexyl)thiophene (2)

To a mixture of magnesium turnings (7.2 g, 0.50 mol), anhydrous ether (50 mL) and a small amount of iodine in a 250 mL flask, a solution of 2 ethylhexylbromide (55 g, 28.5 mol) in anhydrous ether (75 mL) was added slowly under $N_2$. After refluxing for 2 h, the solution was transferred to another dropping funnel and added dropwise to a mixture of 3-bromothiophene (40.8 g, 0.25 mol), Ni(dppp)$Cl_2$ (1.7 g, 3 mmol) and anhydrous ether (80 mL) placed in a 500 mL flask at ice-water bath. After the mixture was stirred overnight at 35° C., the reaction was quenched by pouring cold HCl aq. (2 N) into the mixture. The product was extracted with $CHCl_3$ and dried over anhydrous $Mg_2SO_4$. The crude product was further purified by column chromatography using hexane as the eluent to give a clear liquid (43.7 g, 89.2%). $^1$H NMR (500 MHz, $CDCl_3$) δ: 7.10 (d, 1H, J=5.5), 6.92 (m, 1H, J=5.5), 6.75 (d, 1H, J=5.5), 2.59 (d, 2H, J=7.0), 1.58-1.56 (m, 1H), 1.27-1.30 (m, 8H), 0.85-0.91 (m, 6H).

2-bromo-3-(2'-ethyl-1'-hexyl)thiophene (3)

To 300 mL of THF solution of 2 (40 g, 200 mmol), N-bromosuccinimide (36.3 g, 200.4 mmol) in 40 mL DMF solution was added dropwise at room temperature and the mixture was stirred for another 12 h without light. After that, the organic solution washed with 400 mL water and extracted using ether. And the organic phase was dried over anhydrous $Mg_2SO_4$. The crude product was further purified by vacuum distillation to give a colorless liquid (54 g, 98%). %). $^1$H NMR (500 MHz, $CDCl_3$) δ: 7.18 (d, 1H, J=5.5), 6.76 (d, 1H, J=5.5), 2.50 (d, 2H, J=7.0), 1.58-1.61 (m, 1H), 1.18-1.31 (m, 8H), 0.85-0.91 (m, 6H).

2-hexyl-(2'-ethyl-1'-hexyl)thiophene (4)

To a mixture of magnesium turnings (3.64 g, 0.15 mol), anhydrous ether (15 mL) and a small amount of iodine in a 250 mL flask, a solution of n-hexylbromide (21.5 g, 0.13 mol) in anhydrous ether (50 mL) was added slowly under $N_2$. After refluxing for 2 h, the solution was transferred to another dropping funnel and added dropwise to a mixture of 3 (27.5 g, 0.1 mol), Ni(dppp)$Cl_2$ (0.57 g, 1 mmol) and anhydrous ether (50 mL) placed in a 250 mL flask at ice-water bath. After the mixture was stirred overnight at 35° C., the reaction was quenched by pouring cold HCl aq. (2 N) into the mixture. The product was extracted with $CHCl_3$ and dried over anhydrous $Mg_2SO_4$. The crude product was further purified by column chromatography using hexane as the eluent to give a clear liquid (20 g, 70.2%). $^1$H NMR (500 MHz, $CDCl_3$) δ: 7.02 (d, 1H, J=5.0), 6.81 (d, 1H, J=5.0), 2.72 (t, 2H, J=8.0), 2.51 (d, 2H, J=6.5), 1.57-1.60 (m, 2H), 1.44-1.46 (m, 1H), 1.27-1.30 (m, 14H), 0.85-0.90 (m, 9H).

4,8-bis(2,5-di(2'-hexyl-(2"-ethyl-1"-hexyl)thienyl)-benzo[1,2-b:4,5-b']dithiophene (5)

To a solution of 4 (6.31 g, 22.5 mmol) in 25 mL THF, n-butyllithium 23.6 mmol, 9.45 mL) was added dropwise at 0° C., then the mixture was slowly warmed up to 50° C. and stirred for 2 h. Followed by the adding of 4,8-dehydrobenzo[1,2-b:4,5-b']dithiophene-4,8-dione (1.65 g, 7.5 mmol) and the mixture was stirred for overnight at 50° C. After cooling down to ambient temperature, SnCl$_2$ (8.54 g, 45 mmol) in 10% HCl (24 mL) was added, and the mixture was stirred for an additional 1 h and poured into ice water. The mixture was extracted by ether three times, and the combined organic solution was dried over anhydrous Mg$_2$SO$_4$ and concentrated. Further purification was carried out by column chromatography using hexanes as eluent to obtain pure 5 as a light yellow liquid (2.54 g, yield 45.3%). $^1$H NMR (500 MHz, CDCl$_3$) δ: 7.70 (d, 2H, J=5.0), 7.52 (d, 2H, J=5.0), 7.23 (d, 2H, J=5.0), 2.89 (t, 4H, J=7.5), 2.60 (d, 4H, J=7.5), 1.75-1.80 (m, 4H), 1.66-1.69 (m, 2H), 1.37-1.40 (m, 28H), 0.97-0.99 (m, 18H).

2,9-bis(trimethyltin)-4,8-bis(2,5-di(2'-hexyl-(2"-ethyl-1"-hexyl)thienyl)-benzo[1,2-b:4,5-b'] dithiophene (6)

5 (2.4 g, 3.2 mmol) was dissolved in 30 mL anhydrous THF and cooled to −40° C. under argon protection. n-Butyllithium (2.95 mL, 7.4 mmol) was added dropwise. The mixture was kept at −40° C. for 1 h and then slowly heated up to 50° C. for another 2 hour. Then the mixture was cooled to −40° C. again, and 9.25 mL (9.25 mmol) of trimethyltin chloride solution (1 M in hexane) was added by syringe and slowly heated up to room temperature to keep stirring for another 12 h. After that, the reaction was quenched with 50 mL of water and extracted with ether. The organic extraction was dried with anhydrous Na$_2$SO$_4$ and evaporated to remove the solvent. Recrystallization of the residue from isopropanol yields the titled compound as yellow solid (2.58 g, 75%). $^1$H NMR (500 MHz, CDCl$_3$) δ: 7.70 (s, 2H), 7.19 (s, 2H), 2.85 (t, 4H, J=9.5), 2.55 (d, 4H, J=9.0), 1.60-1.65 (m, 4H), 1.66-1.69 (m, 2H), 1.34-1.37 (m, 28H), 0.90-0.96 (m, 18H), 0.56 (s, 18H).

Poly{2,9-bis(trimethyltin)-4,8-bis(2,5-di(2'-hexyl-(2"-ethyl-1-hexyl)thienyl)-benzo[1,2-b:4,5-b']dithiophene-alt-2'-ethylhexyl-6-dibromo-3-fluorothieno[3,4-b]thiophene-2-carboxylate} (PTBT-2) 2'-ethylhexyl-6-dibromo-3-fluorothieno[3,4-b]thiophene-2-carboxylate (236.1 mg, 0.5 mmol), compound 6 (536.4 mg, 0.5 mmol) and Pd(PPh$_3$)$_4$ (24.5 mg) were weighted into a 25 mL one-neck round-bottom flask. The flask was subjected to three successive cycles of vacuum followed by refilling with argon. Then anhydrous DMF (2 mL) and anhydrous toluene (8 mL) were added via a syringe. The polymerization was carried out at 120° C. for 1 day under argon protection. The raw product was precipitated into methanol and collected by filtration. The precipitate was dissolved in chloroform and filtered through Celite. After precipitated from methanol again, the collected polymer was washed with methanol (8 h), hexanes (12 h) and acetone (5 h) in a Soxhlet apparatus. Finally the polymer was extracted with chloroform. The polymer solution was condensed to about 5 mL and slowly poured in methanol (150 mL). The precipitate was collected and dried by vacuum overnight to yield PTBT-1 (350 mg, 66.1%). $^1$H NMR (400 MHz, CD$_2$ClCD$_2$Cl, 373 K) δ: 8.50-8.00 (br, 2H), 7.80-6.50 (br, 2H), 4.75-4.25 (br, 2H), 3.50-2.85 (br, 8H), 2.50-0.60 (br, 67H); GPC: M$_w$=23.5×10$^3$ g/mol, PDI=1.81.

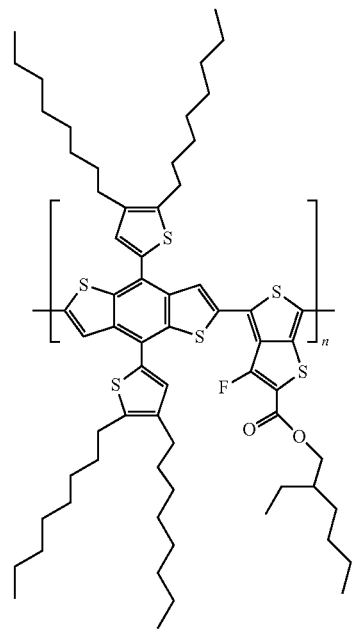

PTBT-1

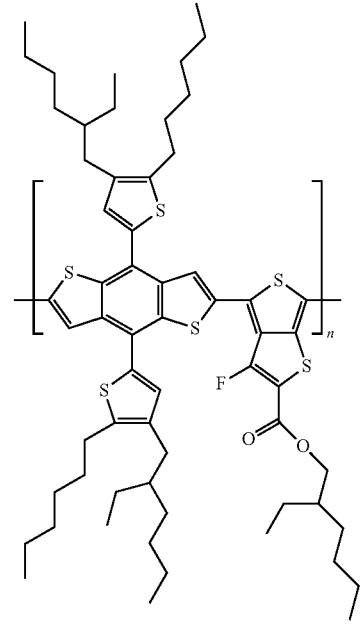

PTBT-2

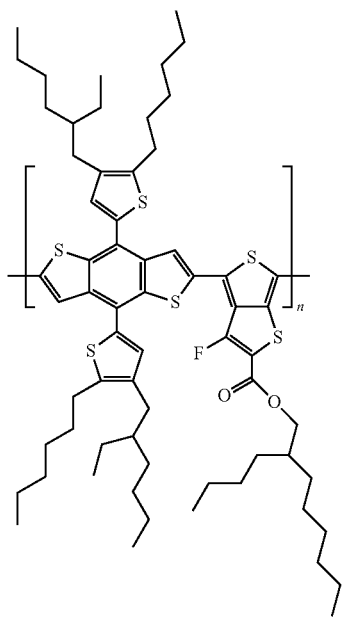

PTBT-3

PTBT-1

$^1$H NMR (400 MHz, CD$_2$ClCD$_2$Cl, 373 K) δ: 8.55-8.00 (br, 2H), 7.70-6.40 (br, 2H), 4.75-4.15 (br, 2H), 3.40-2.95 (br, 8H), 2.60-0.50 (br, 75H); GPC: M$_w$=38.7×10$^3$ g/mol, PDI=1.47.

PTBT-3

$^1$H NMR (400 MHz, CD$_2$ClCD$_2$Cl, 373 K) δ: 8.50-8.00 (br, 2H), 7.80-6.50 (br, 2H), 4.75-4.25 (br, 2H), 3.50-2.85 (br, 8H), 2.50-0.60 (br, 71H); GPC: M$_w$=8.6×10$^3$ g/mol, PDI=1.91.

Device Fabrication.

The polymers were co-dissolved with PC$_{61}$BM in chloroform, chlorobenzene (CB) and 1,2-dichlorobenzene (DCB) with or without 2% (v/v) 1,8-diiodooctance in the weight ratio of 1:1, respectively. Polymer's concentrations are normally 10 mg/mL.

Indium Tin Oxide (ITO)-coated glass substrates (15 Ω/sq) were cleaned stepwise in detergent, water, acetone, and isopropyl alcohol under ultrasonication for 15 min each and subsequently dried in an oven for 1 min at 80° C. under vacuum. Then after treated by a ultraviolet ozone for 20 min, a thin layer of PEDOT:PSS was spin-coated onto ITO surface at 4000 rpm. After being baked at 80° C. for ~45 min under vacuum, the polymer/PCBM composites layer was then spin-cast from the blend solutions on this substrate. The spin coating speed is changed based on the solvent used, for chloroform normally at 2500 rpm, under which we got the highest power conversion efficiency in the work; for CB and DCB normally at 1000 rpm. Then the prepared device was transferred into a nitrogen-filled glovebox, which was installed with a thermal evaporator inside. A Ca layer (20 nm) and an Al layer (60 nm) were deposited in sequence under the vacuum of 2×10$^6$ torr. The effective area of film was measured to be 0.0314 cm$^2$. The current density-voltage (J-V curves were measured using a Keithley 2420 source-measure unit. The photocurrent was measured under AM 1.5 G illumination at 100 mW/cm$^2$ under the Newport Oriel Sol3A Class AAA Solar Simulators 450 W solar simulator (Model: 94023A, 2 in.×2 in. beam size).

Instrumentation.

UV-Vis Absorption and Cyclic Voltammetry.

The optical absorption spectra were taken by a Shimadzu UV-2401PC spectrophotometer. Cyclic voltammetry (CV) was used to study the electrochemical properties of the polymers. For calibration, the redox potential of ferrocene/ferrocenium (Fc/Fc$^+$) was measured under the same conditions, and it is located at 0.06 V to the Ag/Ag$^+$ electrode. It is assumed that the redox potential of Fc/Fc$^+$ has an absolute energy level of −4.80 eV to vacuum. The energy levels of the highest (HOMO) and lowest unoccupied molecular orbital (LUMO) were then calculated according to the following equations:

$$E_{HOMO}=-(\phi_{ox}+4.74)eV; E_{LUMO}=-(\phi_{red}+4.74)eV$$

where $\phi_{ox}$ is the onset oxidation potential vs. Ag/Ag$^+$ and $\phi_{red}$ is the onset reduction potential vs. Ag/Ag$^+$.

Hole Mobility.

Hole mobility was measured according to previous reports, using a diode configuration of ITO/PEDOT (poly(ethylenedioxythiophene):PSS (poly(styrenesulfonate)/polymer/Al by taking current-voltage current in the range of 0-6 V and fitting the results to a space charge limited form, where the space charge limited current (SCLC) is described by J=9∈$_0$∈$_r$μV$^2$/8L$^3$, where ∈$_0$ is the permittivity of free space, ∈$_r$ is the dielectric constant of the polymer, μ is the hole mobility, V is the voltage drop across the device (V=V$_{appl}$−V$_r$−V$_{bi}$, V$_{appl}$: the applied voltage to the device; V$_r$: the voltage drop due to contact resistance and series resistance across the electrodes; V$_{bi}$: the built-in voltage due to the difference in work function of the two electrodes), and L is the polymer film thickness. The resistance of the device was measured using a blank configuration ITO/PEDOT:PSS/Al and was found to be about 10-20Ω. The V$_{bi}$ was deduced from the best fit of the J$^{0.5}$ vs V$_{appl}$ plot at voltages above 2.5 V and is found to be about 1.5 V. The dielectric constant, e$_r$, is assumed to be 3 in our analysis, which is a typical value for conjugated polymers. The thickness of the polymer films is measured by using AFM.

Grazing Incidence Wide-Angle X-ray Scattering (GI-WAXS) Measurements.

GIWAXS measurements were performed using Beamline 8ID-E at Advanced Photon Source (APS), Argonne National Laboratory. Scattering intensities are expressed as a function of the scattering vector, q=4π/λ sin θ, where θ is the half scattering angle and λ=1.6868 Å is the wavelength of the incident radiation. The d-spacing of a peak is expressed by 2π/q. A two-dimensional area detector was used to collect the scattering images and was situated at 200.4 or 158.6 mm from the sample for GIWAXS measurements. The films were illuminated by X-rays at 7.35 keV at an incidence angle of about 0.2°, which is above the critical angle of both homopolymers and polymer/PC61BM blends and blow the critical angle of Si substrate. Thus, X-ray beam could penetrate the entire thickness of the film.

The following references are herein specifically incorporated in their entirety: U.S. Ser. No. 12/509,359, U.S. Ser. No. 12/499,460, U.S. Ser. No. 12/432,665, U.S. Ser. No. 12/179, 387, U.S. Ser. No. 12/049,252, PCT/US2010/042794, U.S. Ser. No. 12/826,344, PCT/US2009/037197, PCT/US2010/037469, PCT/US2009/055717, U.S. Ser. No. 12/240,334, PCT/US2009/054173, PCT/US2006/041283, PCT/US2005/016741, U.S. Pat. No. 7,750,341, U.S. Ser. No. 11/596,585, U.S. Ser. No. 12/210,468, PCT/US2007/064179, PCT/US2005/008478, U.S. Ser. No. 11/921,236, PCT/US2006/021155, PCT/US2006/025597, U.S. Ser. No. 11/922,051, PCT/US2006/025598, PCT/US2003/11689, U.S. Ser. No. 12/747,087, PCT/US2009/031004, PCT/US2006/015048, U.S. Ser. No. 11/918,893, U.S. Ser. No. 11/887,938, PCT/US2006/012719, U.S. Ser. No. 11/882,225, U.S. Ser. No. 10/927,174, PCT/US2004/002710, U.S. Ser. No. 11/131,980, U.S. Ser. No. 10/399,586, U.S. Ser. No. 10/150,862, U.S. Ser. No. 11/666,303, PCT/US2007/00407, PCT/US2005/045047, PCT/US2008/09107, PCT/US2008/009107, U.S. Ser. No. 09/601,068, PCT/US98/21665, PCT/US1999/27024, U.S. Ser. No. 10/542,843, PCT/US2004/002932, U.S. Ser. No. 12/175,261, U.S. Ser. No. 11/664,701, PCT/US2005/038137, U.S. Ser. No. 10/581,797, PCT/US2004/040368, U.S. Pat. No. 7,759,674, U.S. Ser. No. 10/592,664, PCT/US2005/031043, PCT/US2007/019093, U.S. Pat. No. 7,476,893, U.S. Ser. No. 10/569,755, PCT/US2004/027579, PCT/US2009/044364, PCT/US2008/069210, PCT/US2002/22531, PCT/US2002/22533, PCT/US2002/22532, PCT/US2002/22376, and U.S. Pat. No. 5,399,664.

The invention claimed is:

1. A polymer comprising a monomer of formula I:

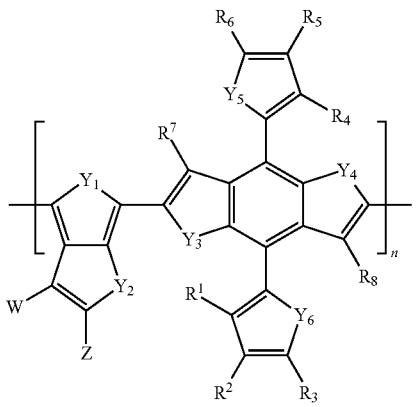

Formula I where each of $R_1$, $R_2$, $R_4$, $R_5$, $R_7$, and $R_8$ is independently H, $C_{1-30}$ alkyl, $C_{1-30}$ alkoxy, $C_{6-30}$ aryl, $C_{6-30}$ aryloxy, 5- to 30-membered heteroaryl, or 5- to 30-membered heteroaryloxy, a cross-linkable moiety or oligo (ethylene glycol);

$R_3$ and $R_6$ are each 3,7-dimethyloctyl;

each of $Y_1$, $Y_2$, $Y_3$, $Y_4$, $Y_5$, and $Y_6$ is independently O, S, Se, or amino;

Z is a $C_{1-30}$ ester, $C_{1-30}$ ketone, $C_{1-30}$ amide, cyano, $C_{1-30}$ alkyl, $C_{1-30}$ polyfluoroalkyl, $C_{1-30}$ polychloroalkyl, $C_{6-30}$ aryl, or 5- to 30-membered heteroaryl;

W is H, halogen, cyano, dicyanovinyl, or tricyanovinyl; and n is an integer.

2. The polymer of claim 1, wherein each of $Y_1$, $Y_2$, $Y_3$, $Y_4$, $Y_5$, and $Y_6$ is S.

3. The polymer of claim 1, wherein Z is a $C_{1-30}$ ester.

4. The polymer of claim 3, wherein Z is an ester having a branched alkyl group.

5. The polymer of claim 1, wherein W is halogen.

6. The polymer of claim 1, where W is fluoro.

7. The polymer of claim 1, where each of $R_1$, $R_2$, $R_4$, $R_5$, $R_7$, and $R_8$ is H.

8. The polymer of claim 3, wherein Z is 3,7-dimethyloctyl carbonate.

9. A polymer of the formula:

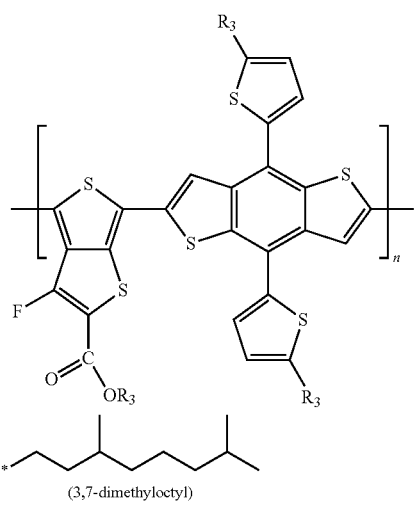

$R_3 =$ (3,7-dimethyloctyl)

where n is an integer.

10. The polymer of claim 9, where the number-average molecular weight of the polymer is between 8 and 50 kDa.

11. The polymer of claim 9, where the polydispersity index is between 1.5 and 4.

12. A method of using a photovoltaic polymer, comprising: providing a polymer of claim 1 for use in a solar cell, an optical device, an electroluminescent device, a photovoltaic cell, semiconducting cell, or photodiode.

13. A composition comprising a polymer according to claim 1 and an electron-withdrawing fullerene derivative.

14. The composition of claim 13, where the electron-withdrawing fullerene derivative is [6,6]-phenyl-$C_{61}$-butyric acid methyl ester.

15. A method of using a photovoltaic polymer, comprising: providing a polymer of claim 13 for use in a solar cell, an optical device, an electroluminescent device, a photovoltaic cell, semiconducting cell, or photodiode.

16. A method of using a photovoltaic polymer, comprising: providing a polymer of claim 9 for use in a solar cell, an optical device, an electroluminescent device, a photovoltaic cell, semiconducting cell, or photodiode.

17. A composition comprising a polymer according to claim 9 and an electron-withdrawing fullerene derivative.

18. The composition of claim 17, where the electron-withdrawing fullerene derivative is [6,6]-phenyl-$C_{61}$-butyric acid methyl ester.

* * * * *